United States Patent
Lin et al.

(10) Patent No.: US 10,429,902 B2
(45) Date of Patent: Oct. 1, 2019

(54) CONNECTING MECHANISM AND ELECTRONIC DEVICE

(71) Applicants: Shu-Hung Lin, Taipei (TW);
Wang-Hung Yeh, Taipei (TW);
Shih-Chin Chou, Taipei (TW);
Hsin-Chieh Fang, Taipei (TW);
Chun-Wen Wang, Taipei (TW);
Che-Hsien Lin, Taipei (TW)

(72) Inventors: Shu-Hung Lin, Taipei (TW);
Wang-Hung Yeh, Taipei (TW);
Shih-Chin Chou, Taipei (TW);
Hsin-Chieh Fang, Taipei (TW);
Chun-Wen Wang, Taipei (TW);
Che-Hsien Lin, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/175,870

(22) Filed: Oct. 31, 2018

(65) Prior Publication Data

US 2019/0155342 A1 May 23, 2019

Related U.S. Application Data

(60) Provisional application No. 62/580,437, filed on Nov. 1, 2017.

(51) Int. Cl.
*G06F 1/16* (2006.01)
*G06F 1/3234* (2019.01)
*H05K 5/02* (2006.01)

(52) U.S. Cl.
CPC .......... *G06F 1/1679* (2013.01); *G06F 1/3275* (2013.01); *H05K 5/0217* (2013.01)

(58) Field of Classification Search
None
See application file for complete search history.

(56) References Cited

U.S. PATENT DOCUMENTS

| 7,692,919 B2 | 4/2010 | Liang et al. | |
| 8,964,363 B2 * | 2/2015 | Hu | G06F 3/02 16/221 |

(Continued)

FOREIGN PATENT DOCUMENTS

| CN | 102053654 | 3/2015 |
| TW | I307006 | 3/2009 |
| TW | I544308 | 8/2016 |

*Primary Examiner* — Xanthia C Cunningham
(74) *Attorney, Agent, or Firm* — JCIPRNET

(57) ABSTRACT

An electronic device includes a first body and a second body. The first body includes a connecting mechanism having a base, at least one locking member, a limiting member, and a driving member connected to the limiting member. The locking member includes at least one locking portion. The second body has a through hole. At least one of a plurality of inner sidewalls of the through hole has at least one locking hole. When the connecting mechanism is located in the through hole and the driving member is in a locked state, the locking portion is protruded from at least one opening of the base and extended into the locking hole. When the driving member is actuated to an unlocked state, the driving member drives the limiting member to move and the locking member moves relative to the base such that the locking portion is retracted into the base.

35 Claims, 11 Drawing Sheets

(56) References Cited

U.S. PATENT DOCUMENTS

| | | | | |
|---|---|---|---|---|
| 9,459,657 B2* | 10/2016 | Kim | ................. | G06F 1/1632 |
| 9,651,993 B2* | 5/2017 | Huang | ................. | G06F 1/1632 |
| 9,898,043 B2* | 2/2018 | Agata | ................. | G06F 1/1632 |
| 2006/0103495 A1* | 5/2006 | Chen | ................. | G06F 1/1616 |
| | | | | 335/205 |
| 2008/0024966 A1* | 1/2008 | Huang | ................. | G06F 1/1626 |
| | | | | 361/679.06 |
| 2013/0155583 A1* | 6/2013 | Yang | ................. | G06F 1/1626 |
| | | | | 361/679.01 |
| 2013/0250501 A1* | 9/2013 | Guo | ................. | H05K 5/0221 |
| | | | | 361/679.01 |
| 2014/0126126 A1* | 5/2014 | Chuang | ................. | G06F 1/1626 |
| | | | | 361/679.01 |
| 2015/0092333 A1* | 4/2015 | Kim | ................. | G06F 1/1632 |
| | | | | 361/679.17 |
| 2016/0062402 A1* | 3/2016 | Matsumoto | ................. | G06F 1/1632 |
| | | | | 361/679.43 |
| 2016/0292463 A1* | 10/2016 | Moore | ................. | E05B 73/0082 |

\* cited by examiner

CONNECTING MECHANISM AND ELECTRONIC DEVICE

CROSS-REFERENCE TO RELATED APPLICATION

This application claims the priority benefit of U.S. provisional application Ser. No. 62/580,437, filed on Nov. 1, 2017. The entirety of the above-mentioned patent application is hereby incorporated by reference herein and made a part of this specification.

BACKGROUND OF THE INVENTION

Field of the Invention

The invention relates to a connecting mechanism and an electronic device that uses this connecting mechanism.

Description of Related Art

The upper body of some of the electronic devices today may be detached from the lower body for use as a tablet computer. However, if the disassembly and assembly procedure between the upper body and the lower body is inconvenient, then the ease with which the user performs the procedure is affected. Therefore, how to make the mechanism easier for the user to operate is the direction of research in this field.

SUMMARY OF THE INVENTION

The invention provides a connecting mechanism and an electronic device, wherein the second body of the electronic device may be easily assembled and detached from the first body by using the connecting mechanism with a locking hole, and the operation is relatively simple and convenient.

The electronic device of the invention includes a first body and a second body. The first body includes a connecting mechanism, and the connecting mechanism includes a base, at least one locking member, a limiting member, and a driving member. The base has at least one opening. The locking member is movably disposed in the base and includes at least one locking portion. The limiting member is movably disposed in the base and connected to the locking member. The driving member is connected to the limiting member. The second body is detachably assembled to the first body and has a through hole. At least one of a plurality of inner sidewalls of the through hole has at least one locking hole. When the connecting mechanism of the first body is located in the through hole of the second body and the driving member is in a locked state, the locking portion of the locking member is protruded from the opening of the base and extended into the locking hole of the second body, such that the second body is assembled on the first body. When the driving member is actuated from the locked state to an unlocked state, the driving member drives the limiting member to move so as to drive the locking member moving relative to the base, such that the locking portion is retracted into the base and the second body can be detached from the first body.

In an embodiment of the invention, at least one opening of the base includes a plurality of first openings and a plurality of second openings opposite to each other. The at least one locking member includes a first locking member and a second locking member. The at least one locking portion includes a plurality of first locking portions and a plurality of second locking portions. The at least one locking hole includes a plurality of first locking holes and a plurality of second locking holes.

In an embodiment of the invention, the first locking member and the second locking member are sequentially disposed in the base. The first locking member includes a plurality of first convex shafts and a first locking portion. The second locking member includes a plurality of second convex shafts and a second locking portion. The limiting member is located between the first locking member and the second locking member and has a plurality of first limiting grooves and a plurality of second limiting grooves. The first convex shafts penetrate the first limiting grooves, and the second convex shafts penetrate the second limiting grooves. The first limiting grooves are extended along a first tilt direction, the second limiting grooves are extended along a second tilt direction, and the first tilt direction is different from the second tilt direction.

In an embodiment of the invention, the connecting mechanism further includes: a cover and a connector assembly. The cover is located between the driving member and the second locking member and includes a first portion and a second portion. The first portion has a limiting opening. The driving member is movably disposed on the first portion. A driving portion of the driving member passes through the limiting opening for connecting the limiting member and driving the limiting member to move. The second portion has a height difference with the first portion. The connector assembly is fixed onto the first locking member and includes a connector cable and a plurality of connectors connected to the connector cable. When the driving member is in the locked state, the first locking portion of the first locking member and the connectors of the connector assembly are respectively protruded from the first opening of the base and extended into the first locking holes of the second body, and the second locking portions of the second locking member are respectively protruded from the second opening of the base and extended into the second locking holes of the second body. When the driving member is actuated from the locked state to the unlocked state, the driving member drives the limiting member to move so as to drive the first locking member and the second locking member moving relative to the base such that the first locking portion, the second locking portion, and the connectors are retracted into the base.

In an embodiment of the invention, the driving member is in a first position corresponding to a locked state and the driving member is in a second position corresponding to an unlocked state. When the driving member moves between the first position and the second position, the first convex shafts of the first locking member and the second convex shafts of the second locking member respectively slide within the first limiting grooves and within the second limiting grooves of the limiting member. When the driving member is in the first position or the second position, the first convex shafts and the second convex shafts are respectively located on different reference lines.

In an embodiment of the invention, the driving member includes a system power distributor, a shape memory alloy (SMA), and a power supply circuit. The shape memory alloy is connected and fixed onto the limiting member. The power supply circuit is connected to the shape memory alloy and the system power distributor.

In an embodiment of the invention, the connecting mechanism further includes a cover, an elastic member, a connector assembly, and a blocking assembly. The cover is located above the second locking member. The elastic member is connected to the limiting member and the base, wherein the elastic member and the driving member are respectively located at two opposite sides of the limiting member. The connector assembly is fixed onto the first locking member and includes a connector cable and a plurality of connectors connected to the connector cable. The blocking assembly includes a blocking portion and an elastic portion. The elastic portion is connected to the blocking portion and the base. The force direction of the elastic portion is different from the force direction of the elastic member. When the driving member is in the locked state, the first locking portion of the first locking member is protruded from the first opening of the base and extended into the first locking holes of the second body, the second locking portion of the second locking member and the connectors of the connector assembly are respectively protruded from the second opening of the base and extended into the second locking holes of the second body, and the blocking portion of the blocking assembly is leaned against the limiting member. When the driving member is actuated from the locked state to the unlocked state, the system power distributor supplies power to the shape memory alloy via the power supply circuit to drive the limiting member to move so as to stretch the elastic member, and the first locking member and the second locking member move relative to the base such that the first locking portion, the second locking portion, and the connectors are retracted into the base.

In an embodiment of the invention, the first locking member is located on the same plane as the second locking member. The first locking member includes a plurality of first limiting grooves and a first locking portion. The second locking member includes a plurality of second limiting grooves and a second locking portion. The limiting member is located between the base and both of the first locking member and the second locking member and includes a convex track body and a plurality of first convex tracks and a plurality of second convex tracks connected to the convex track body. The first convex tracks penetrate the first limiting grooves, and the second convex tracks penetrate the second limiting grooves. The first limiting grooves are extended along a first tilt direction, the second limiting grooves are extended along a second tilt direction, and the first tilt direction is different from the second tilt direction.

In an embodiment of the invention, the connecting mechanism further includes a cover and a connector assembly. The cover is located between the driving member and both of the first locking member and the second locking member and includes a first portion and a second portion. The first portion has a limiting opening. The driving member is movably disposed on the first portion, and a driving portion of the driving member passes through the limiting opening for connecting to the limiting member and driving the limiting member to move. The second portion has a height difference with the first portion. The connector assembly is fixed onto the first locking member and includes a connector cable and a plurality of connectors connected to the connector cable. When the driving member is in the locked state, the first locking portion of the first locking member and the connectors of the connector assembly are respectively protruded from the first opening of the base and extended into the first locking holes of the second body, and the second locking portions of the second locking member are respectively protruded from the second opening of the base and extended into the second locking holes of the second body. When the driving member is actuated from the locked state to the unlocked state, the driving member drives the limiting member to move so as to drive the first locking member and the second locking member moving relative to the base such that the first locking portion, the second locking portion, and the connectors are retracted into the base.

In an embodiment of the invention, the driving member is in a first position corresponding to a locked state and the driving member is in a second position corresponding to an unlocked state. When the driving member moves between the first position and the second position, the first convex tracks and the second convex tracks of the limiting member respectively slide within the first limiting grooves of the first locking member and the second limiting grooves of the second locking member.

In an embodiment of the invention, the driving member includes a system power distributor, a shape memory alloy, and a power supply circuit. The shape memory alloy is connected and fixed onto the limiting member. The power supply circuit is connected to the shape memory alloy and the system power distributor.

In an embodiment of the invention, the connecting mechanism further includes a cover, an elastic member, a connector assembly, and a blocking assembly. The cover is located above the first locking member and the second locking member. The elastic member is connected to the limiting member and the base, wherein the elastic member and the driving member are respectively located at two opposite sides of the limiting member. The connector assembly is fixed onto the first locking member and includes a connector cable and a plurality of connectors connected to the connector cable. The blocking assembly includes a blocking portion and an elastic portion. The elastic portion is connected to the blocking portion and the base, wherein the force direction of the elastic portion is different from the force direction of the elastic member. When the driving member is in the locked state, the first locking portion of the first locking member and the connectors of the connector assembly are respectively protruded from the first opening of the base and extended into the first locking holes of the second body, the second locking portions of the second locking member are respectively protruded from the second opening of the base and extended into the second locking holes of the second body, and the blocking portion of the blocking assembly is leaned against the limiting member. When the driving member is actuated from the locked state to the unlocked state, the system power distributor supplies power to the shape memory alloy via the power supply circuit to drive the limiting member to move so as to stretch the elastic member, and the first locking member and the second locking member move relative to the base such that the first locking portion, the second locking portion, and the connectors are retracted into the base.

In an embodiment of the invention, the at least one opening of the base is a plurality of openings. The at least one locking portion includes a plurality of locking portions. The at least one locking hole is a plurality of locking holes. The limiting member includes a convex track body and a plurality of sub-convex tracks, and the sub-convex tracks are connected to the convex track body. The locking member is located between the limiting member and the driving member and has a plurality of limiting grooves. The sub-convex tracks penetrate the limiting grooves.

In an embodiment of the invention, the connecting mechanism further includes a cover and a connector assembly. The cover is located between the driving member and the locking member and includes a first portion and a second portion. The first portion has a limiting opening. The driving member is movably disposed on the first portion, and a driving portion of the driving member passes through the limiting opening for connecting to the limiting member and driving the limiting member to move. The second portion has a height difference with the first portion. The connector assembly is fixed onto the locking member and includes a connector cable and a plurality of connectors connected to the connector cable. When the driving member is in the locked state, the locking portion of the locking member and the connectors of the connector assembly are respectively protruded from the opening of the base and extended into the locking hole of the second body. When the driving member is actuated from the locked state to an unlocked state, the driving member drives the limiting member to move so as to drive the locking member moving relative to the base such that the locking portion and the connectors are retracted into the base.

In an embodiment of the invention, the driving member is in a first position corresponding to a locked state and the driving member is in a second position corresponding to an unlocked state. When the driving member moves between the first position and the second position, the sub-convex tracks of the limiting member respectively slide within the limiting grooves of the locking member.

In an embodiment of the invention, the driving member includes a system power distributor, a shape memory alloy, and a power supply circuit. The shape memory alloy is connected and fixed onto the limiting member. The power supply circuit is connected to the shape memory alloy and the system power distributor.

In an embodiment of the invention, the connecting mechanism further includes a cover, an elastic member, a connector assembly, and a blocking assembly. The cover is located above the locking member. The elastic member is connected to the limiting member and the base, wherein the elastic member and the driving member are respectively located at two opposite sides of the limiting member. The connector assembly is fixed onto the locking member and includes a connector cable and a plurality of connectors connected to the connector cable. The blocking assembly includes a blocking portion and an elastic portion. The elastic portion is connected to the blocking portion and the base, wherein the force direction of the elastic portion is different from the force direction of the elastic member. When the driving member is in the locked state, the locking portion of the locking member and the connectors of the connector assembly are respectively protruded from the opening of the base and extended into the locking hole of the second body, and the blocking portion of the blocking assembly is leaned against the limiting member. When the driving member is actuated from the locked state to the unlocked state, the system power distributor supplies power to the shape memory alloy via the power supply circuit to drive the limiting member to move so as to drive the locking member moving relative to the base to stretch the elastic member, such that the locking portion and the connectors are retracted into the base.

In an embodiment of the invention, the base includes a bottom surface and a plurality of side surfaces connected to the bottom surface. The at least one opening is disposed on at least one of the side surfaces. The bottom surface and the side surfaces define an accommodating space.

In an embodiment of the invention, the first body has a work plane and the connecting mechanism is disposed on the work plane.

In an embodiment of the invention, one of the first body and the second body is a display module, and the other of the first body and the second body is a system host.

The connecting mechanism of the invention includes a base, at least one locking member, a limiting member, and a driving member. The base has at least one opening. The locking member is movably disposed in the base and includes at least one locking portion. The limiting member is movably disposed in the base and connected to the locking member. The driving member is connected to the limiting member. When the driving member is in a locked state, the locking portion of the locking member is protruded from the opening of the base, and when the driving member is actuated from the locked state to an unlocked state, the driving member drives the limiting member to move so as to drive the locking member moving relative to the base such that the locking portion is retracted into the base.

In an embodiment of the invention, the at least one opening of the base includes a plurality of first openings and a plurality of second openings opposite to each other. The at least one locking member includes a first locking member and a second locking member. The at least one locking portion includes a plurality of first locking portions and a plurality of second locking portions. The at least one locking hole includes a plurality of first locking holes and a plurality of second locking holes.

In an embodiment of the invention, the first locking member and the second locking member are sequentially disposed in the base. The first locking member includes a plurality of first convex shafts and a first locking portion. The second locking member includes a plurality of second convex shafts and a second locking portion. The limiting member is located between the first locking member and the second locking member and has a plurality of first limiting grooves and a plurality of second limiting grooves. The first convex shafts penetrate the first limiting grooves, and the second convex shafts penetrate the second limiting grooves. The first limiting grooves are extended along a first tilt direction, the second limiting grooves are extended along a second tilt direction, and the first tilt direction is different from the second tilt direction.

In an embodiment of the invention, the connecting mechanism further includes: a cover and a connector assembly. The cover is located between the driving member and the second locking member and includes a first portion and a second portion. The first portion has a limiting opening. The driving member is movably disposed on the first portion. A driving portion of the driving member passes through the limiting opening for connecting to the limiting member and driving the limiting member to move. The second portion has a height difference with the first portion. The connector assembly is fixed onto the first locking member and includes a connector cable and a plurality of connectors connected to the connector cable.

In an embodiment of the invention, the driving member includes a system power distributor, a shape memory alloy (SMA), and a power supply circuit. The shape memory alloy is connected and fixed onto the limiting member. The power supply circuit is connected to the shape memory alloy and the system power distributor.

In an embodiment of the invention, the connecting mechanism further includes a cover, an elastic member, a connector assembly, and a blocking assembly. The cover is located above the second locking member. The elastic member is connected to the limiting member and the base, wherein the elastic member and the driving member are respectively located at two opposite sides of the limiting member. The connector assembly is fixed onto the first locking member and includes a connector cable and a plurality of connectors connected to the connector cable. The blocking assembly includes a blocking portion and an elastic portion. The elastic portion is connected to the blocking portion and the base. The force direction of the elastic portion is different from the force direction of the elastic member.

In an embodiment of the invention, the first locking member is located on the same plane as the second locking member. The first locking member includes a plurality of first limiting grooves and a first locking portion. The second locking member includes a plurality of second limiting grooves and a second locking portion. The limiting member is located between the base and both of the first locking member and the second locking member and includes a convex track body and a plurality of first convex tracks and a plurality of second convex tracks connected to the convex track body. The first convex tracks penetrate the first limiting grooves, and the second convex tracks penetrate the second limiting grooves. The first limiting grooves are extended along a first tilt direction, the second limiting grooves are extended along a second tilt direction, and the first tilt direction is different from the second tilt direction.

In an embodiment of the invention, the connecting mechanism further includes a cover and a connector assembly. The cover is located between the driving member and both of the first locking member and the second locking member and includes a first portion and a second portion. The first portion has a limiting opening. The driving member is movably disposed on the first portion, and a driving portion of the driving member passes through the limiting opening for connecting to the limiting member and driving the limiting member to move. The second portion has a height difference with the first portion. The connector assembly is fixed onto the first locking member and includes a connector cable and a plurality of connectors connected to the connector cable.

In an embodiment of the invention, the driving member includes a system power distributor, a shape memory alloy, and a power supply circuit. The shape memory alloy is connected and fixed onto the limiting member. The power supply circuit is connected to the shape memory alloy and the system power distributor.

In an embodiment of the invention, the connecting mechanism further includes a cover, an elastic member, a connector assembly, and a blocking assembly. The cover is located above the first locking member and the second locking member. The elastic member is connected to the limiting member and the base, wherein the elastic member and the driving member are respectively located at two opposite sides of the limiting member. The connector assembly is fixed onto the first locking member and includes a connector cable and a plurality of connectors connected to the connector cable. The blocking assembly includes a blocking portion and an elastic portion. The elastic portion is connected to the blocking portion and the base, wherein the force direction of the elastic portion is different from the force direction of the elastic member.

In an embodiment of the invention, the at least one opening of the base is a plurality of openings. The at least one locking portion includes a plurality of locking portions. The at least one locking hole is a plurality of locking holes. The limiting member includes a convex track body and a plurality of sub-convex tracks, and the sub-convex tracks are connected to the convex track body. The locking member is located between the limiting member and the driving member and has a plurality of limiting grooves. The sub-convex tracks penetrate the limiting grooves.

In an embodiment of the invention, the connecting mechanism further includes a cover and a connector assembly. The cover is located between the driving member and the locking member and includes a first portion and a second portion. The first portion has a limiting opening. The driving member is movably disposed on the first portion, and a driving portion of the driving member passes through the limiting opening for connecting to the limiting member and driving the limiting member to move. The second portion has a height difference with the first portion. The connector assembly is fixed onto the locking member and includes a connector cable and a plurality of connectors connected to the connector cable.

In an embodiment of the invention, the driving member includes a system power distributor, a shape memory alloy, and a power supply circuit. The shape memory alloy is connected and fixed onto the limiting member. The power supply circuit is connected to the shape memory alloy and the system power distributor.

In an embodiment of the invention, the connecting mechanism further includes a cover, an elastic member, a connector assembly, and a blocking assembly. The cover is located above the locking member. The elastic member is connected to the limiting member and the base, wherein the elastic member and the driving member are respectively located at two opposite sides of the limiting member. The connector assembly is fixed onto the locking member and includes a connector cable and a plurality of connectors connected to the connector cable. The blocking assembly includes a blocking portion and an elastic portion. The elastic portion is connected to the blocking portion and the base, wherein the force direction of the elastic portion is different from the force direction of the elastic member.

In an embodiment of the invention, the base includes a bottom surface and a plurality of side surfaces connected to the bottom surface. The at least one opening is disposed on at least one of the side surfaces. The bottom surface and the side surfaces define an accommodating space.

Based on the above, in the design of the electronic device of the invention, the first body has a connecting mechanism and the connecting mechanism drives the limiting member to move via the driving member and the locking member moving relative to the base such that the locking portion is retracted into the base or protruded from the opening of the base and extended into the locking hole of the second body. Therefore, the second body can be detached or assembled on the first body. In short, the electronic device of the invention is relatively simple and convenient to assemble and detach.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a portion of this specification. The drawings illustrate embodiments of the invention and, together with the description, serve to explain the principles of the invention.

DESCRIPTION OF THE EMBODIMENTS

Figure 1A:
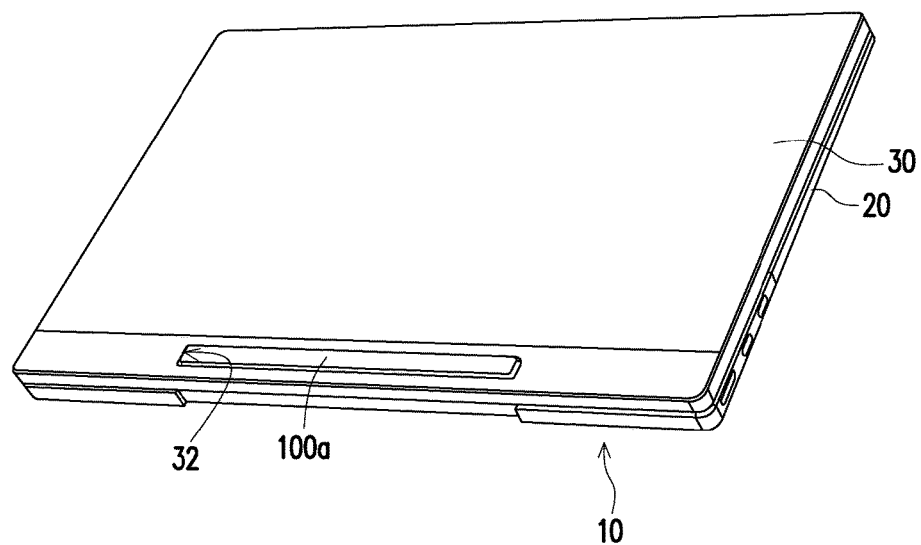
FIG. 1A shows a perspective view of an electronic device of an embodiment of the invention.
Figure 1B:
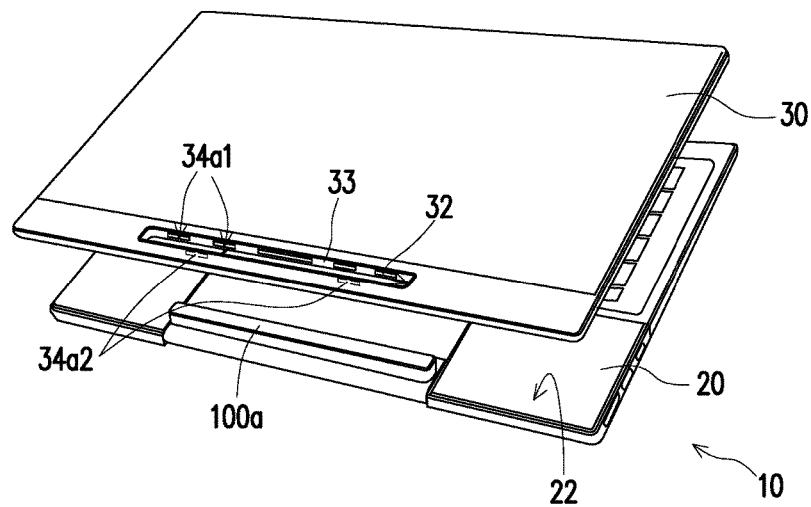
FIG. 1B shows a perspective view of the second body of the electronic device of FIG. 1A detached from the first body.
Figure 2A:
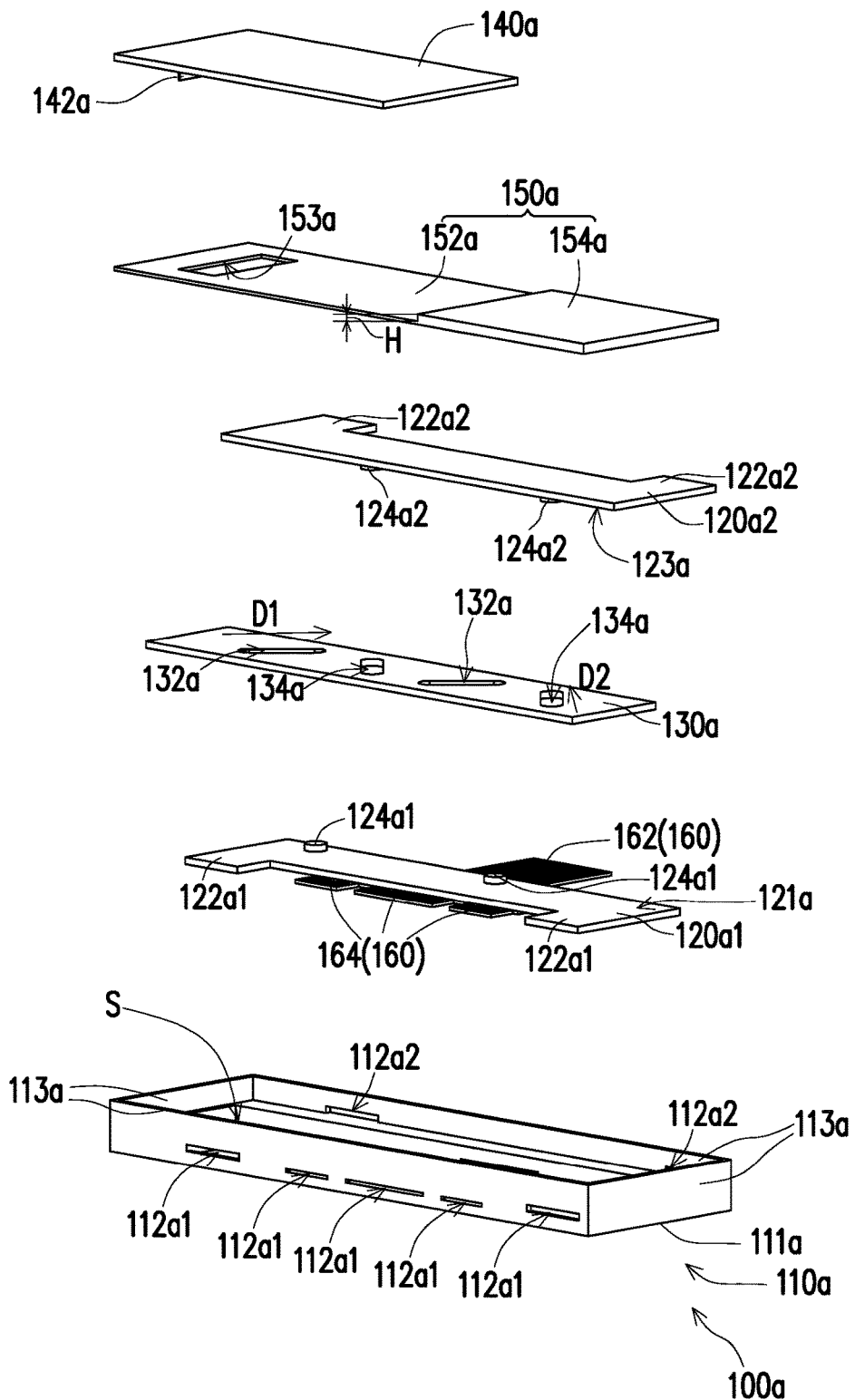
FIG. 2A is a perspective exploded view of the connecting mechanism of the first body of the electronic device of FIG. 1A.
Figure 2B:
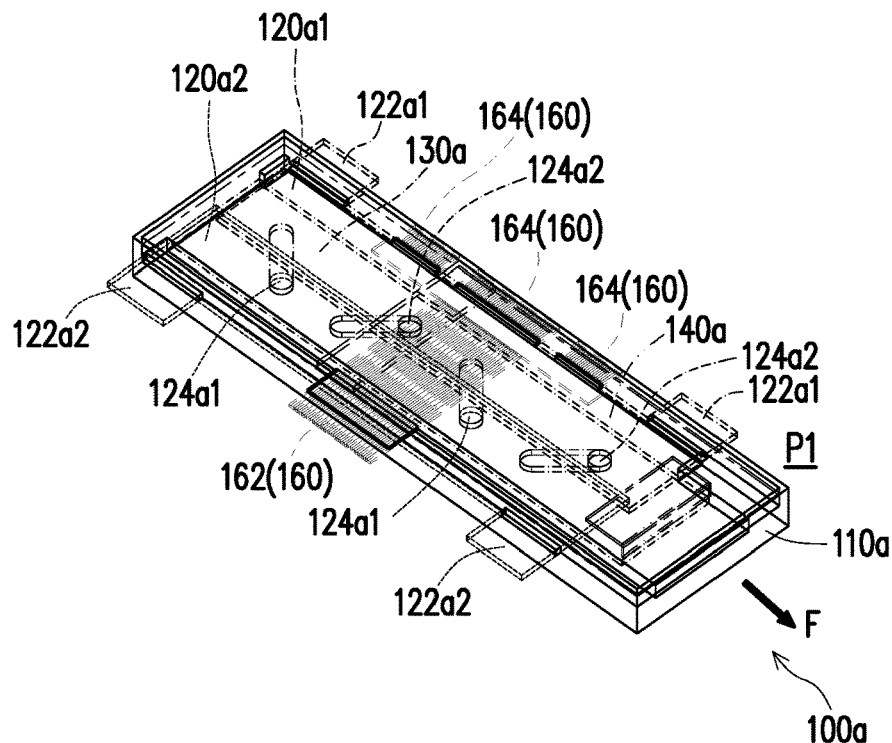
FIG. 2B and FIG. 2C are respectively perspective views of the connecting mechanism of FIG. 2A in a locked state and an unlocked state.
Figure 2C:
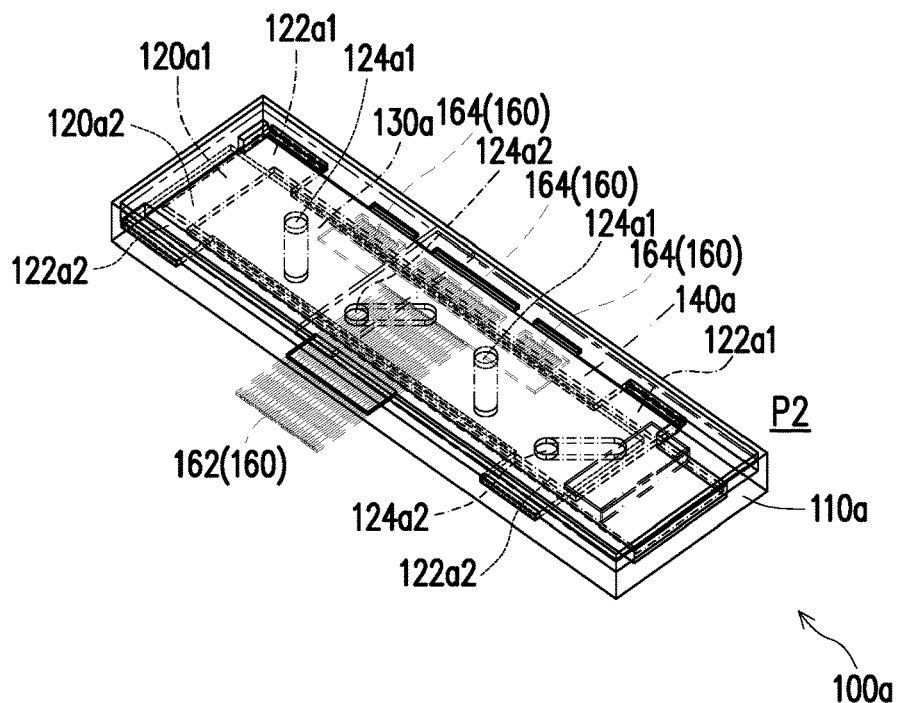

FIG. 1A shows a perspective view of an electronic device of an embodiment of the invention. FIG. 1B shows a perspective view of the second body of the electronic device of FIG. 1A detached from the first body. FIG. 2A is a perspective exploded view of the connecting mechanism of the first body of the electronic device of FIG. 1A. FIG. 2B and FIG. 2C are respectively perspective views of the connecting mechanism of FIG. 2A in a locked state and an unlocked state.

Referring first to FIG. 1A, FIG. 1B, and FIG. 2A at the same time, in the present embodiment, an electronic device 10 includes a first body 20 and a second body 30. The first body 20 includes a connecting mechanism 100a, and the connecting mechanism 100a includes a base 110a, at least one locking member (two are schematically shown in FIG. 2A, including a first locking member 120a1 and a second locking member 120a2), a limiting member 130a, and a driving member 140a. The base 110a has at least one opening (a plurality of them are schematically shown in FIG. 2A, including a plurality of first openings 112a1 and a plurality of second openings 112a2 opposite to each other). The first locking member 120a1 is movably disposed in the base 110a and includes at least one locking portion (a plurality are schematically shown in FIG. 2A, that is, first locking portions 122a1), and the second locking member 120a2 is movably disposed in the base 110a and includes at least one locking portion (a plurality of them are schematically shown in FIG. 2A, i.e., second locking portions 122a2). Here, the locking member is, for example, a pawl member, but is not limited thereto. The limiting member 130a is movably disposed in the base 110a, the limiting member 130a is connected to the first locking member 120a1 and the second locking member 120a2, and the driving member 140a is connected to the limiting member 130a. The second body 30 is detachably assembled to the first body 20 and has a through hole 32. At least one of a plurality of inner sidewalls 33 of the through hole 32 has at least one locking hole (a plurality of them are schematically shown in FIG. 2A including a plurality of first locking holes 34a1 and a plurality of second locking holes 34a2). The first locking holes 34a1 and the second locking holes 34a2 are respectively recessed in two inner sidewalls 33 opposite to each other.

More specifically, the first body 20 has a work plane 22, and the connecting mechanism 100a is disposed on the work plane 22. One of the first body 20 and the second body 30 is a display module, and the other of the first body 20 and the second body 30 is a system host. Here, the electronic device 10 is, for example, a notebook computer, wherein the first body 20 is, for example, a system host, and the second body 30 is, for example, a display module, or the second body 30 may also be independently used as a body of a tablet computer. In another embodiment not shown, the first body includes a keyboard input module, a touch input module, a touch display module, or a display output module; and the second body includes a keyboard input module, a touch input module, a touch display module, or a display output module. Of course, the types of the electronic device 10, the first body 20, and the second body 30 are not limited thereto.

Furthermore, the base 110a of the connecting mechanism 100a of the present embodiment includes a bottom surface 111a and a plurality of side surfaces 113a connected to the bottom surface 111a. The first openings 112a1 and the second openings 112a2 of the base 110a are respectively disposed on the side surfaces 113a opposite to each other, wherein the number of the first openings 112a1 may be different from the number of the second openings 112a2. The bottom surface 111a and the side surface 113a define an accommodating space S, and the first locking member 120a1, the limiting member 130a, the second locking member 120a2, and the driving member 140a are sequentially disposed in the base 110a and located in the accommodating space S. The first locking member 120a1 further includes a plurality of first convex shafts 124a1, wherein the first convex shafts 124a1 are disposed on an upper surface 121a of the first locking member 120a1. The second locking member 120a2 further includes a plurality of second convex shafts 124a2, wherein the second convex shafts 124a2 are disposed on a lower surface 123a of the second locking member 120a2. The limiting member 130a is located between the first locking member 120a1 and the second locking member 120a2 and has a plurality of first limiting grooves 132a and a plurality of second limiting grooves 134a. The first convex shafts 124a1 penetrate the first limiting grooves 132a, and the second convex shafts 124a2 penetrate the second limiting grooves 134a. The first limiting grooves 132a are extended along a first tilt direction D1, the second limiting grooves 134a are extended along a second tilt direction D2, and the first tilt direction D1 is different from the second tilt direction D2. Here, the first limiting grooves 132a and the second limiting grooves 134a are mirror-symmetrical with respect to an axis of symmetry perpendicular to the extending direction of limiting member 130a.

In addition, the connecting mechanism 100a of the present embodiment also includes a cover 150a and a connector assembly 160. The cover 150a is located between the driving member 140a and the second locking member 120a2 and includes a first portion 152a and a second portion 154a. The first portion 152a has a limiting opening 153a, and the second portion 154a has a height difference H with the first portion 152a. The driving member 140a is movably disposed on the first portion 152a and is limited to the second portion 154a. Preferably, the thickness of the second driving member 140a is approximately equal to the height difference H between the second portion 154a and the first portion 152a. A driving portion 142a of the driving member 140a passes through the limiting opening 153a for connecting the limiting member 130a and driving the limiting member 130a to move. Here, the driving member 140a may be fixed to the limiting member 130a by means of an adhesive or snapping. Of course, in other embodiments not shown, the driving member and the limiting member may also be a one-piece structure. The connector assembly 160 is fixed onto the first locking member 120a1 and includes a connector cable 162 and a plurality of connectors 164 connected to the connector cable 162. Here, the connectors 164 and the first locking portions 122a1 of the first locking member 120a1 face the first openings 112a1 of the base 110a, and the second locking portions 122a2 of the second locking member 120a2 face the second openings 112a2 of the base 110a. Here, the number of the first openings 112a1 is equal to the number of the connectors 164 plus the number of the first locking portions 122a1, and the number of the second openings 112a2 is equal to the number of second locking portions 122a2.

Referring to FIG. 1B, FIG. 2A, and FIG. 2B simultaneously, the second body 30 is first placed on the work plane 22 of the first body 20. After assembly, when the connecting mechanism 100a of the first body 20 is located in the through hole 32 of the second body 30 and the driving member 140a is in a locked state, the first locking portions 122a1 of the first locking member 120a1 and the connectors 164 of the connector assembly 160 are respectively protruded from the first openings 112a1 of the base 110a and extended into the first locking holes 34a1 of the second body 30, and the second locking portions 122a2 of the second locking member 120a2 are respectively protruded from the second openings 112a2 of the base 110a and extended into the second locking holes 34a2 of the second body 30, and therefore the second body 30 may be assembled on the first body 20. The driving member 140a is in a first position P1 when in the locked state, and at this point, the first convex shafts 124a1 and the second convex shafts 124a2 are respectively located on different reference lines.

For disassembly, referring to FIG. 1B, FIG. 2B, and FIG. 2C simultaneously, a force is applied to the driving member 140a along a force direction F, such that the driving member 140a is actuated from the locked state to an unlocked state. When the driving member 140a is actuated from the locked state to the unlocked state, the driving member 140a drives the limiting member 130a to move and the first locking member 120a1 and the second locking member 120a2 move relative to the base 110a such that the first locking portions 122a1, the second locking portions 122a2, and the connectors 164 are retracted into the base 110a. Therefore, the second body 30 may be detached from the first body 20. The driving member 140a is in a second position P2 when in the unlocked state, and at this point, the first convex shafts 124a1 and the second convex shafts 124a2 are respectively located on different reference lines. In short, when the driving member 140a moves between the first position P1 and the second position P2, the first convex shafts 124a1 of the first locking member 120a1 and the second convex shafts 124a2 of the second locking member 120a2 respectively slide within the first limiting grooves 132a and within the second limiting grooves 134a of the limiting member 130a.

In the design of the electronic device 10 of the present embodiment, the connecting mechanism 100a drives the limiting member 130a to move via the driving member 140a and the first locking member 120a1 and the second locking member 120a2 move relative to the base 110a such that the first locking portions 122a1, the second locking the portions 122a2, and the connectors 164 are retracted into the base 110a or protruded from the base 110a and are extended into the first locking holes 34a1 and the second locking holes 34a2 of the second body 30 such that the second body 30 is detached or assembled on the first body 20. In short, the electronic device 10 of the present embodiment is relatively simple and convenient to assemble and detach.

It should be mentioned here that, the following embodiments adopt the reference numerals of the embodiment above and a portion of the contents thereof, wherein the same reference numerals are used to represent the same or similar devices and descriptions of the same technical contents are omitted. The omitted portions are as described in the embodiment above and are not repeated in the embodiments below. The following illustrates different types of the connecting mechanism respectively with different embodiments.

Figure 3A:
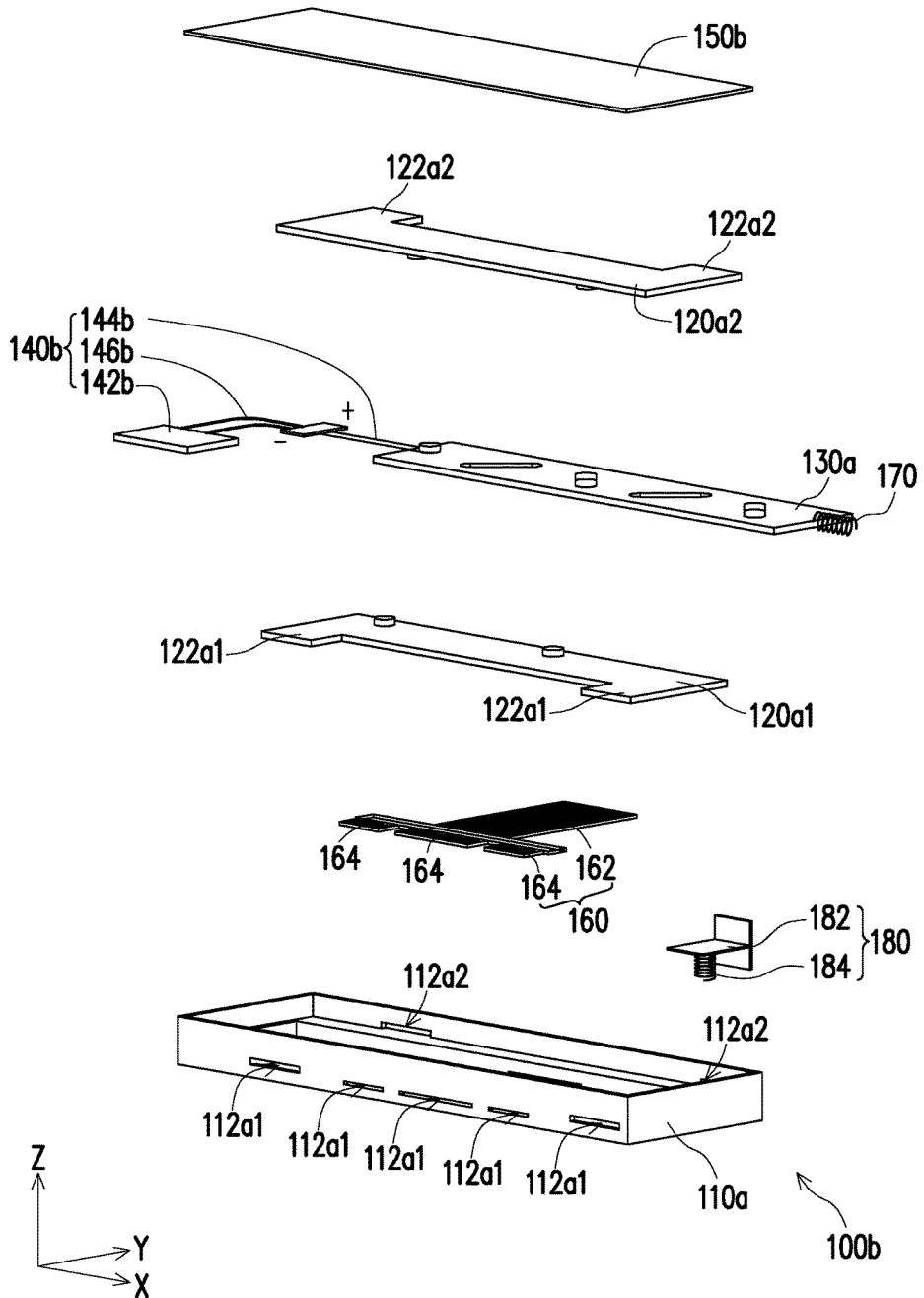
FIG. 3A shows a perspective exploded view of a connecting mechanism of another embodiment of the invention.
Figure 3B:
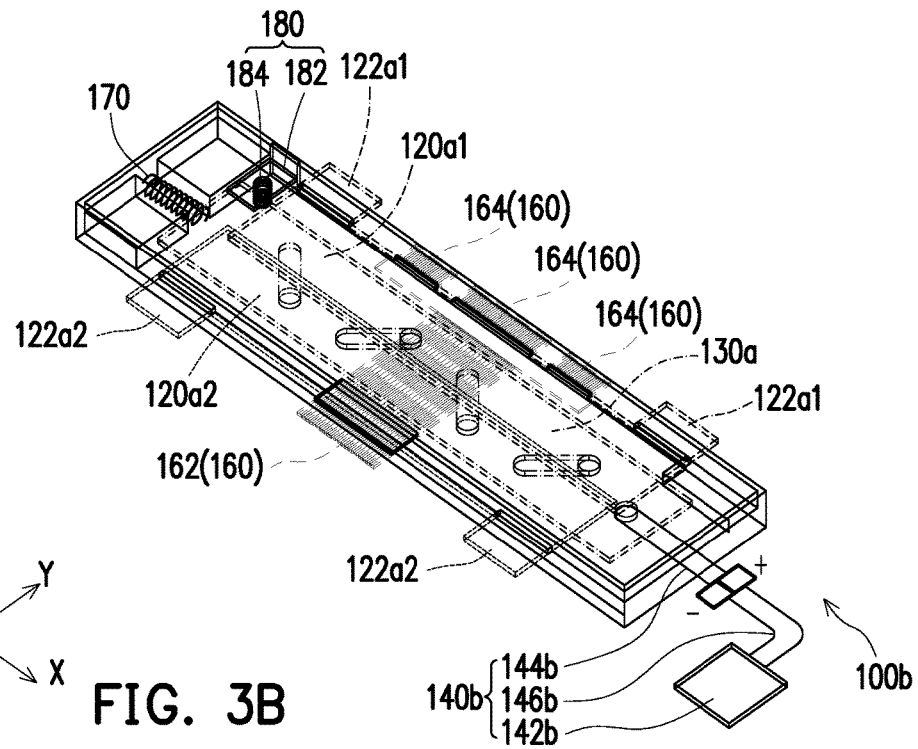
FIG. 3B and FIG. 3C are respectively perspective views of the connecting mechanism of FIG. 3A in a locked state and an unlocked state.
Figure 3C:
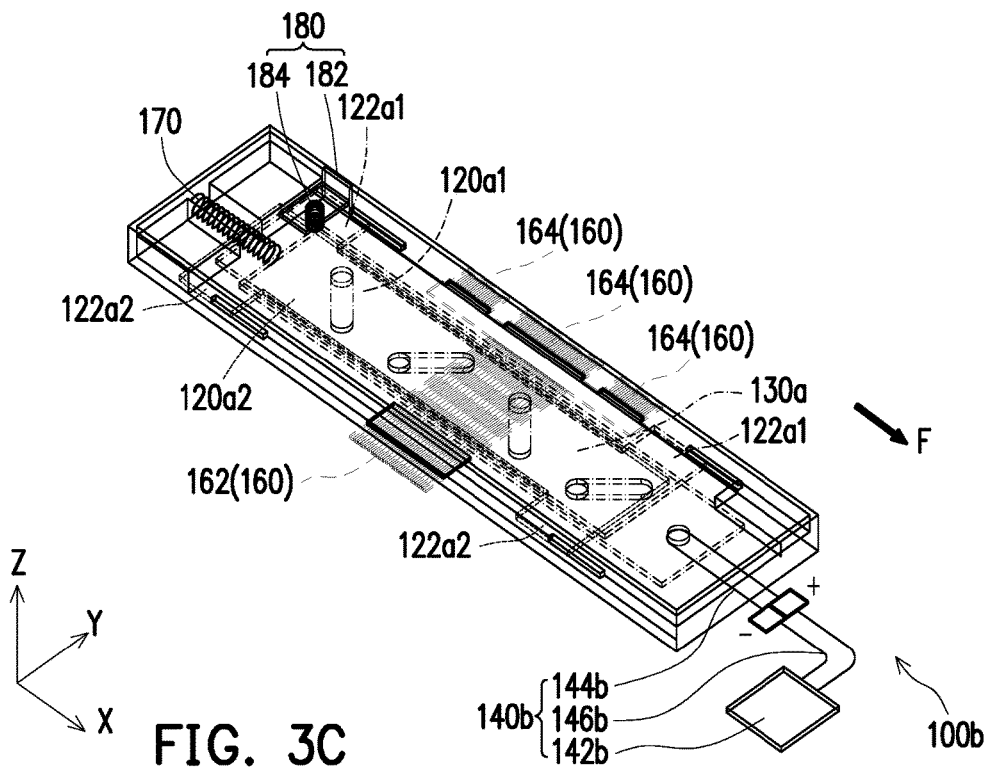

FIG. 3A shows a perspective exploded view of a connecting mechanism of another embodiment of the invention. FIG. 3B and FIG. 3C are respectively perspective views of the connecting mechanism of FIG. 3A in a locked state and an unlocked state. Referring first to FIG. 2A and FIG. 3A simultaneously, a connecting mechanism 100b of the present embodiment is similar to the connecting mechanism 100a in FIG. 2A. The main difference between the two is that the structural designs of a driving member 140b and a cover 150b of the present embodiment are different from the structural designs of the driving member 140a and the cover 150a in FIG. 2A.

In detail, the cover 150b of the present embodiment is embodied as a touch panel located above the second locking member 120a2. The driving member 140b includes a system power distributor 142b, a shape memory alloy 144b, and a power supply circuit 146b. The shape memory alloy 144b is connected and fixed onto the limiting member 130a, wherein the shape memory alloy 144b may be fixed onto the limiting member 130a by means of an adhesive or snapping. The power supply circuit 146b is connected to the shape memory alloy 144b and the system power distributor 142b. Furthermore, the connecting mechanism 100b of the present embodiment further includes an elastic member 170 and a blocking assembly 180. The elastic member 170 is connected to the limiting member 130a and the base 110a, wherein the elastic member 170 and the driving member 140b are respectively located at two opposite sides of the limiting member 130a. The blocking assembly 180 includes a blocking portion 182 and an elastic portion 184, wherein the elastic portion 184 is connected to the blocking portion 182 and the base 110a. The purpose of the blocking assembly 180 set-up is to hold the moving member 130a in the z-axis direction to prevent the moving member 130a from being elastically pulled back by the elastic member 170 in the x-axis direction. Here, the force direction of the elastic portion 184 (such as the z-axis direction) is different from the force direction of the elastic member 170 (such as the x-axis direction).

After assembly, referring first to FIG. 1B, FIG. 3A, and FIG. 3B simultaneously, when the connecting mechanism 100a of the first body 20 is located in the through hole 32 of the second body 30 and the driving member 140a is in the locked state, the first locking portions 122a1 of the first locking member 120a1 are respectively protruded from the first openings 112a1 of the base 110a and extended into the first locking holes 34a1 of the second body 30, and the second locking portions 122a2 of the second locking member 120a2 and the connectors 164 of the connector assembly 160 are respectively protruded from the second openings 112a2 of the base 110a and extended into the second locking holes 34a2 of the second body 30. At this time, the blocking portion 182 of the blocking assembly 180 is leaned against the limiting member 130a, and the blocking portion 182 also interferes with the movement of the first locking portions 122a1 of the first locking member 120a1 in the x-axis direction to prevent the first locking portions 122a1 of the first locking member 120a1 from being elastically pulled back by the elastic member 170 in the x-axis direction.

For disassembly, referring to FIG. 1B, FIG. 3A, and FIG. 3C simultaneously, the cover 150b is touched first to transmit a signal to a control chip (not shown), and the control chip transmits the signal to the system power distributor 142b of the driving member 140b to inform that power is turned on. When the driving member 140b is actuated from the locked state to the unlocked state, the system power distributor 142b supplies power to the shape memory alloy 144b via the power supply circuit 146b. At this time, the power contact is turned on and contracted by heat to drive the limiting member 130a to move so as to stretch the elastic member 170, and the first locking member 120a1 and the second locking member 120a2 move relative to the base 110a, such that the first locking portions 122a1, the second locking portions 122a2, and the connectors 164 are retracted into the base 110a. That is, when the system power distributor 142b supplies power to the shape memory alloy 144b, a force is applied in the force direction F to move the limiting member 130a toward the stretching direction of the shape memory alloy 144b, thereby driving the first locking member 120a1 and the second locking member 120a2 to move relative to the base 110a. Since the limiting member 130a gives way, the potential energy of the elastic portion 184 of the blocking assembly 180 is released and the elastic portion 184 of the blocking assembly 180 is sprung in the z-axis direction, and the elastic portion 184 and the limiting member 130a interfere in the x-axis direction to hold the limiting member 130a to prevent the elastic member 170 from pulling back in the x-axis direction. At this time, the second body 30 may be detached from the first body 20.

Figure 4A:
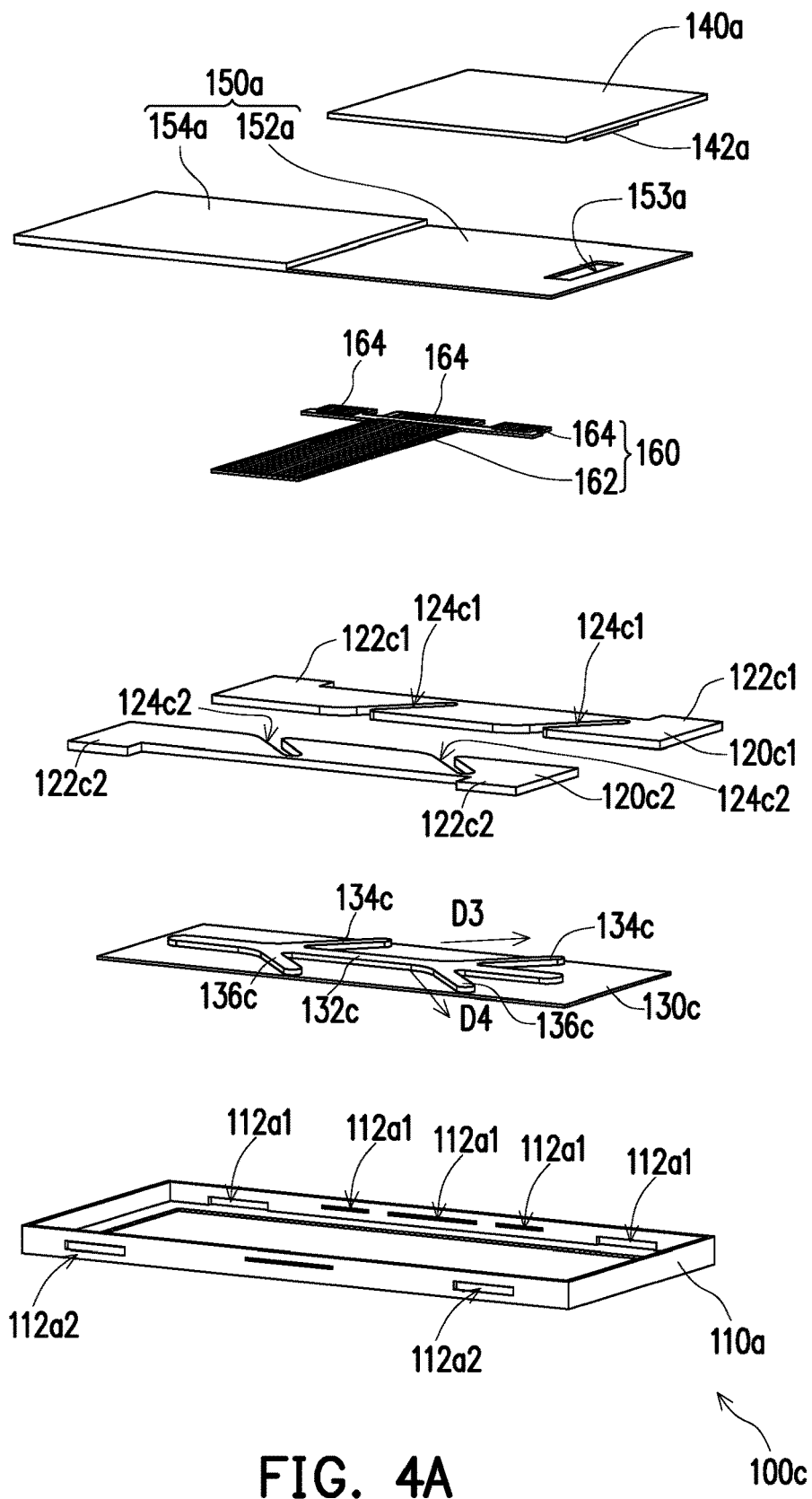
FIG. 4A shows a perspective exploded view of a connecting mechanism of another embodiment of the invention.
Figure 4B:
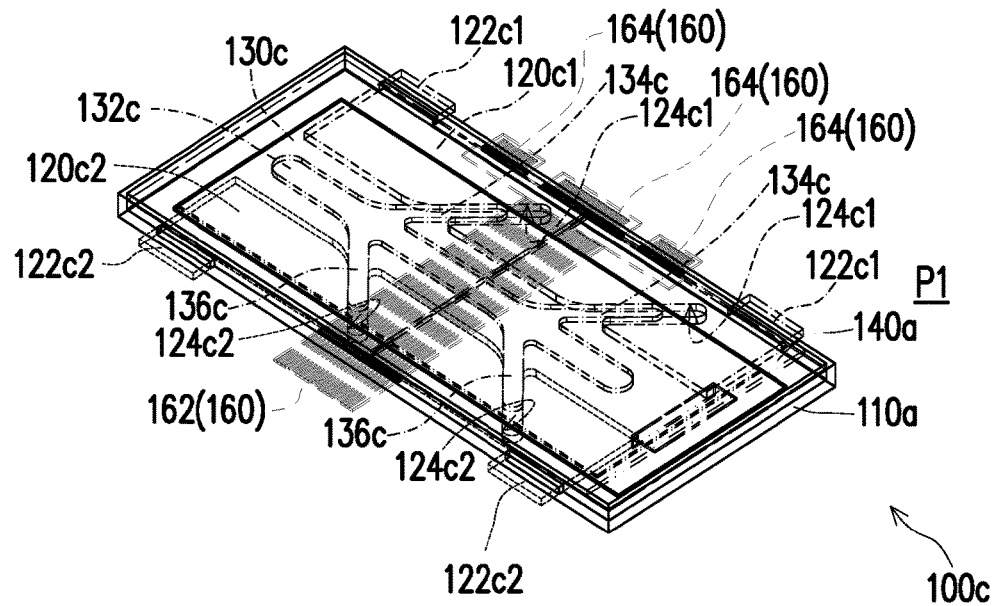
FIG. 4B and FIG. 4C are respectively perspective views of the connecting mechanism of FIG. 4A in a locked state and an unlocked state.
Figure 4C:
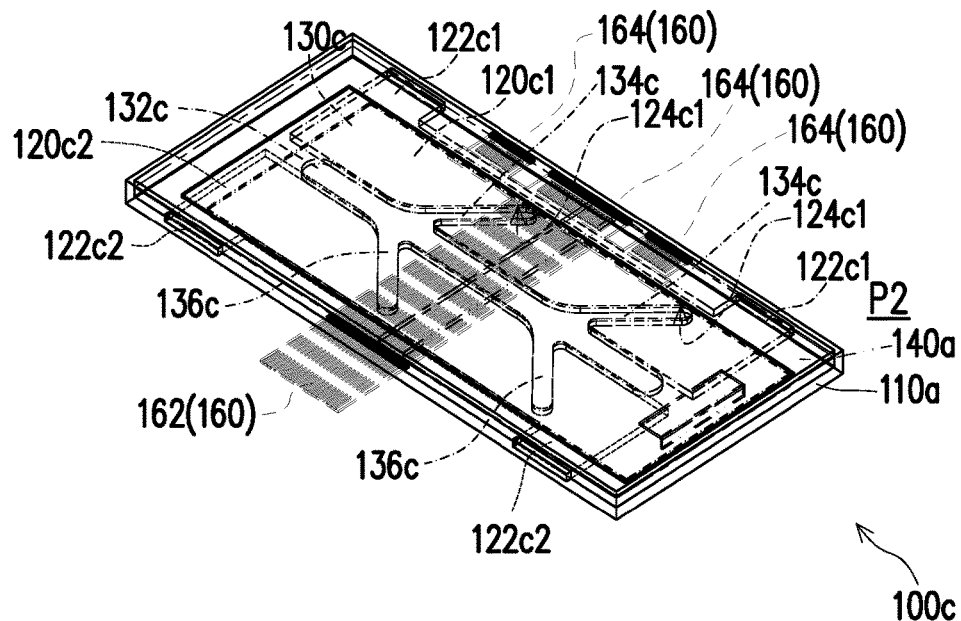

FIG. 4A shows a perspective exploded view of a connecting mechanism of another embodiment of the invention. FIG. 4B and FIG. 4C are respectively perspective views of the connecting mechanism of FIG. 4A in a locked state and an unlocked state. Referring first to FIG. 2A and FIG. 4A simultaneously, a connecting mechanism 100c of the present embodiment is similar to the connecting mechanism 100a of FIG. 2A. The main difference between the two is: the designs of a first locking member 120c1, a second locking member 120c2, and a limiting member 130c of the present embodiment are different from the designs of the first locking member 120a1, the second locking member 120a2, and the limiting member 130a in FIG. 2A.

In detail, the first locking member 120c1 and the second locking member 120c2 of the present embodiment are located on the same plane, and the first locking member 120c1 and the second locking member 120c2 are substantially mirror structures. The first locking member 120c1 includes first locking portions 122c1 and a plurality of first limiting grooves 124c1. The second locking member 120c2 includes second locking portions 122c2 and a plurality of second limiting grooves 124c2. The limiting member 130c is located between the base 110a and both of the first locking member 120c1 and the second locking member 120c2 and includes a convex track body 132c and a plurality of first convex tracks 134c and a plurality of second convex tracks 136c connected to the convex track body 132c. The first convex tracks 134c and the second convex tracks 136c are mirror-symmetrical with respect to the convex track body 132c as the axis of symmetry. The first convex tracks 134c penetrate the first limiting grooves 124c1, and the second convex tracks 136c penetrate the second limiting grooves 124c2. The first limiting grooves 124c1 are extended along a first tilt direction D3, the second limiting grooves 124c2 are extended along a second tilt direction D4, and the first tilt direction D3 is different from the second tilt direction D4.

After assembly, referring first to FIG. 1B, FIG. 4A, and FIG. 4B simultaneously, when the driving member 140a is in the locked state, the first locking portions 122c1 of the first locking member 120c1 and the connectors 164 of the connector assembly 160 are respectively protruded from the first openings 112a1 of the base 110a and extended into the first locking holes 34a1 of the second body 30, and the second locking portions 122c2 of the second locking member 120c2 are respectively protruded from the second openings 112a2 of the base 110a and extended into the second locking holes 34a2 of the second body 30. At this time, the second body 30 is assembled on the first body 20. Next, referring first to FIG. 4B and FIG. 4C simultaneously, when the driving member 140a moves between the first position P1 and the second position P2, the first convex tracks 134c and the second convex tracks 136c of the limiting member 130c respectively slide within the first limiting grooves 124c1 of the first locking member 120c1 and the second limiting grooves 124c2 of the second locking member 120c2. For disassembly, referring to FIG. 4A and FIG. 4C simultaneously, when the driving member 140a is actuated from the locked state to the unlocked state, the driving member 140a drives the limiting member 130c to move and the first locking member 120c1 and the second locking member 120c2 move relative to the base 110a such that the first locking portions 122c1, the second locking portions 122c2, and the connectors 164 are retracted into the base 110a. At this time, the second body 30 may be detached from the first body 20.

Figure 5A:
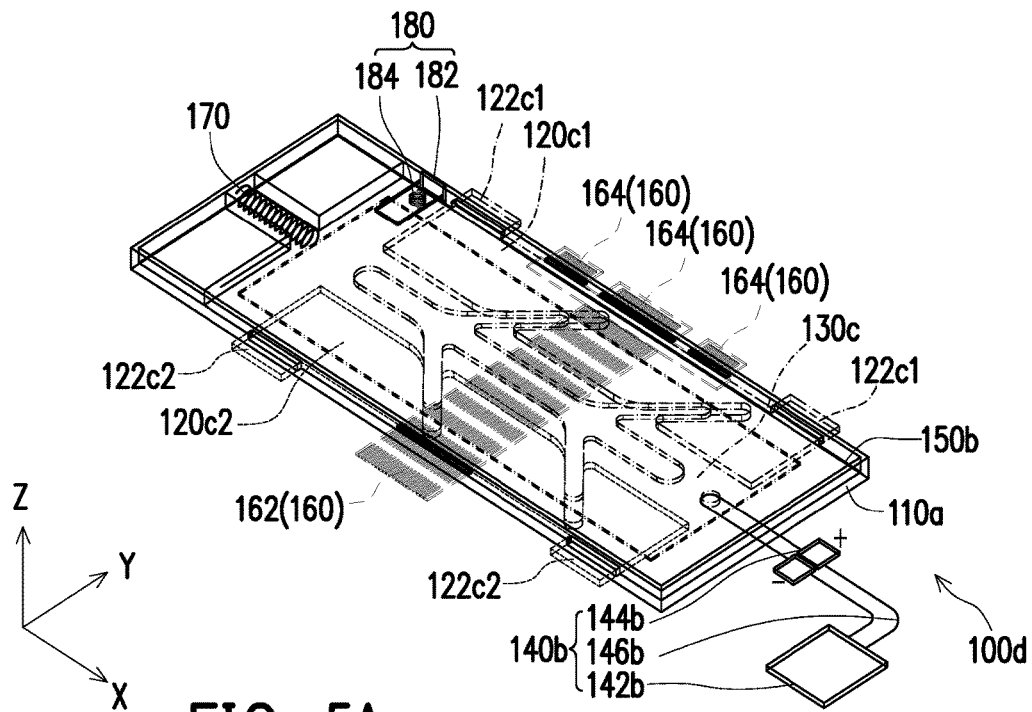
FIG. 5A and FIG. 5B are respectively perspective views of a connecting mechanism of another embodiment of the invention in a locked state and an unlocked state.
Figure 5B:
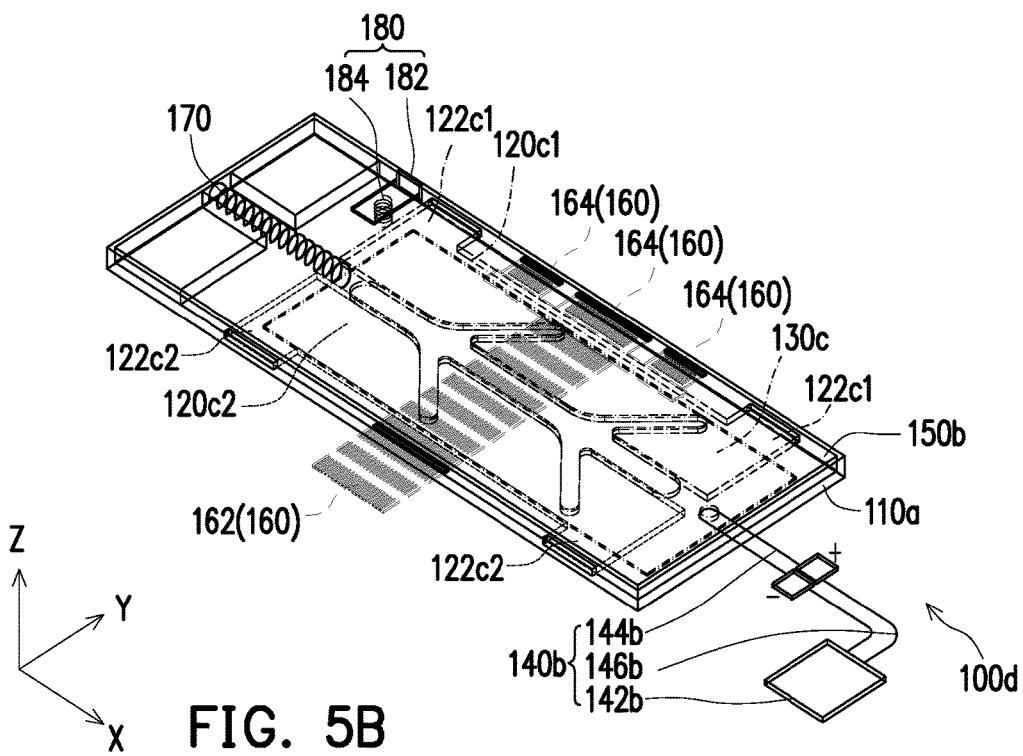

FIG. 5A and FIG. 5B are respectively perspective views of a connecting mechanism of another embodiment of the invention in a locked state and an unlocked state. Referring first to FIG. 4B and FIG. 5A simultaneously, a connecting mechanism 100d of the present embodiment is similar to the connecting mechanism 100c in FIG. 4B. The main difference between the two is that the structural designs of the driving member 140b and the cover 150b of the present embodiment are different from the structural designs of the driving member 140a and the cover 150a in FIG. 4B.

In detail, the cover 150b of the present embodiment is embodied as a touch panel located above the first locking member 120c1 and the second locking member 120c2. The driving member 140b includes a system power distributor 142b, a shape memory alloy 144b, and a power supply circuit 146b. The shape memory alloy 144b is connected and fixed onto the limiting member 130c. The power supply circuit 146b is connected to the shape memory alloy 144b and the system power distributor 142b. Furthermore, the connecting mechanism 100d of the present embodiment further includes an elastic member 170 and a blocking assembly 180. The elastic member 170 is connected to the limiting member 130c and the base 110a, wherein the elastic member 170 and the driving member 140b are respectively located at two opposite sides of the limiting member 130c. The blocking assembly 180 includes a blocking portion 182 and an elastic portion 184, wherein the elastic portion 184 is connected to the blocking portion 182 and the base 110a. The purpose of the blocking assembly 180 set-up is to hold the moving member 130c in the z-axis direction to prevent the moving member 130c from being elastically pulled back by the elastic member 170 in the x-axis direction. Here, the force direction of the elastic portion 184 (such as the z-axis direction) is different from the force direction of the elastic member 170 (such as the x-axis direction).

After assembly, referring first to FIG. 1B, FIG. 4A, and FIG. 5A simultaneously, when the driving member 140b is in the locked state, the first locking portions 122c1 of the first locking member 120c1 and the connectors 164 of the connector assembly 160 are respectively protruded from the first openings 112a1 of the base 110a and extended into the first locking holes 34a1 of the second body 30, and the second locking portions 122c2 of the second locking member 120c2 are respectively protruded from the second openings 112a2 of the base 110a and extended into the second locking holes 34a2 of the second body 30. At this time, the blocking portion 182 of the blocking assembly 180 is leaned against the limiting member 130c, and the blocking portion 182 also interferes with the movement of the first locking portions 122c1 of the first locking member 120c1 in the x-axis direction to prevent the first locking portions 122c1 of the first locking member 120c1 from being elastically pulled back by the elastic member 170 in the x-axis direction.

For disassembly, referring to FIG. 1B and FIG. 5B, and FIG. 3C simultaneously, the cover 150b is touched first to transmit a signal to a control chip (not shown), and the control chip transmits the signal to the system power distributor 142b of the driving member 140b to inform that power is turned on. When the driving member 140b is actuated from the locked state to the unlocked state, the system power distributor 142b supplies power to the shape memory alloy 144b via the power supply circuit 146b. At this time, the power contact is turned on and contracted by heat to drive the limiting member 130c to move so as to stretch the elastic member 170, and the first locking member 120c1 and the second locking member 120c2 move relative to the base 110a, such that the first locking portions 122c1, the second locking portions 122c2, and the connectors 164 are retracted into the base 110a. That is, when the system power distributor 142b supplies power to the shape memory alloy 144b, the limiting member 130c moves toward the stretching direction of the shape memory alloy 144b, thereby driving the first locking member 120c1 and the second locking member 120c2 to move relative to the base 110a. Since the limiting member 130c gives way, the potential energy of the elastic portion 184 of the blocking assembly 180 is released and the elastic portion 184 of the blocking assembly 180 is sprung in the z-axis direction, and the elastic portion 184 and the limiting member 130c interfere in the x-axis direction to hold the limiting member 130c to prevent the elastic member 170 from pulling back in the x-axis direction. At this time, the second body 30 may be detached from the first body 20.

Figure 6A:
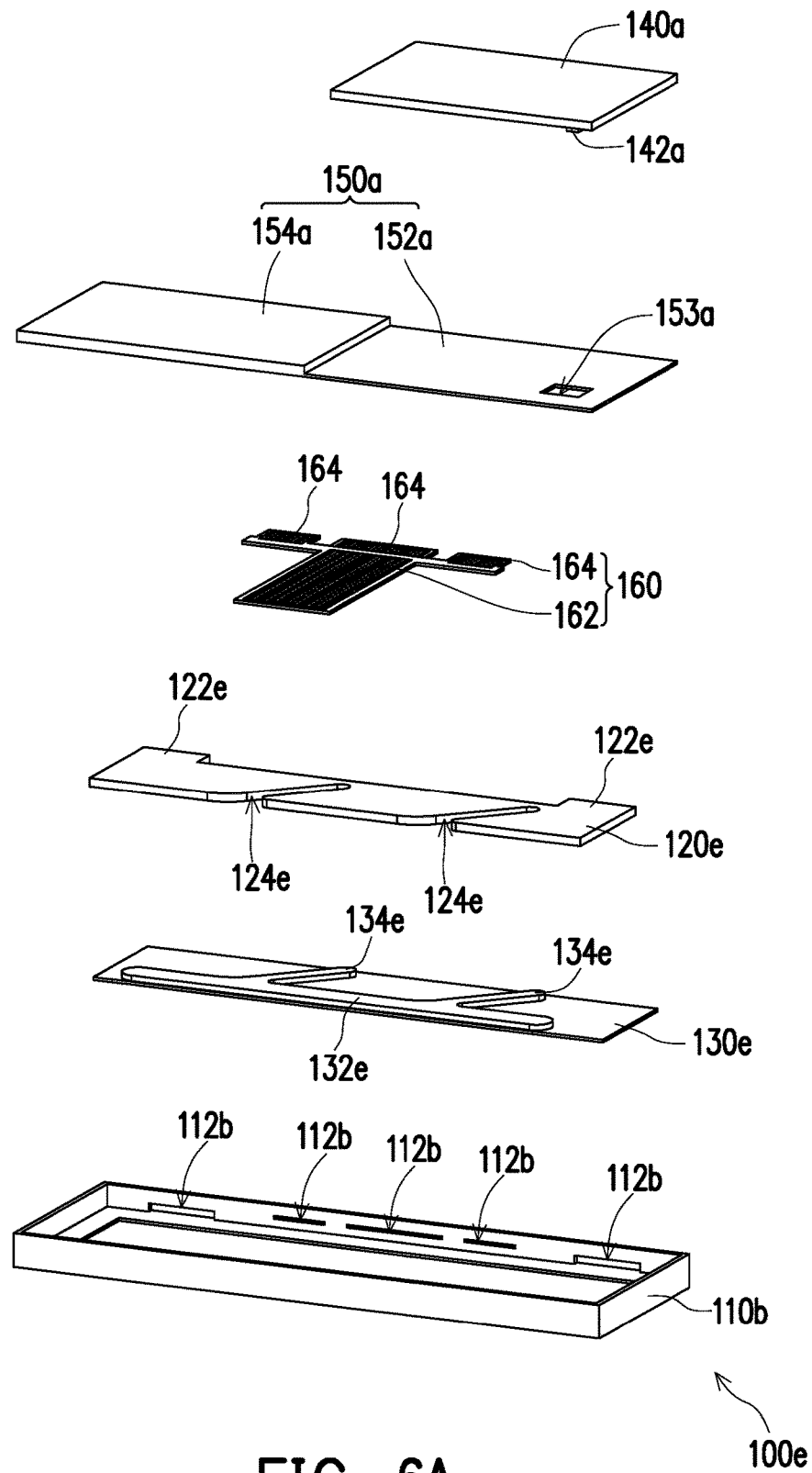
FIG. 6A shows a perspective exploded view of a connecting mechanism of another embodiment of the invention.
Figure 6B:
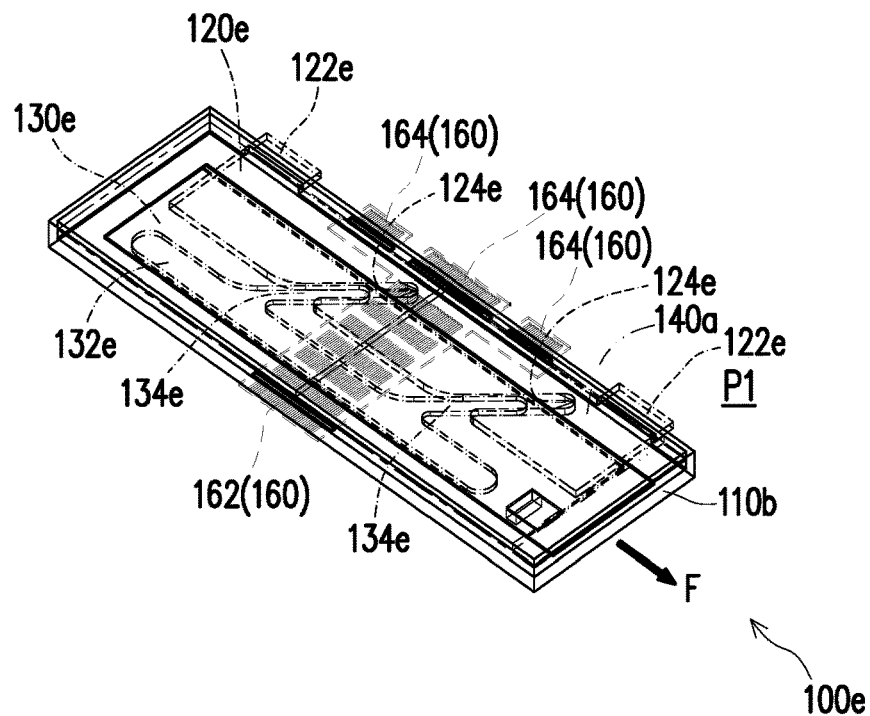
FIG. 6B and FIG. 6C are respectively perspective views of the connecting mechanism of FIG. 6A in a locked state and an unlocked state.
Figure 6C:
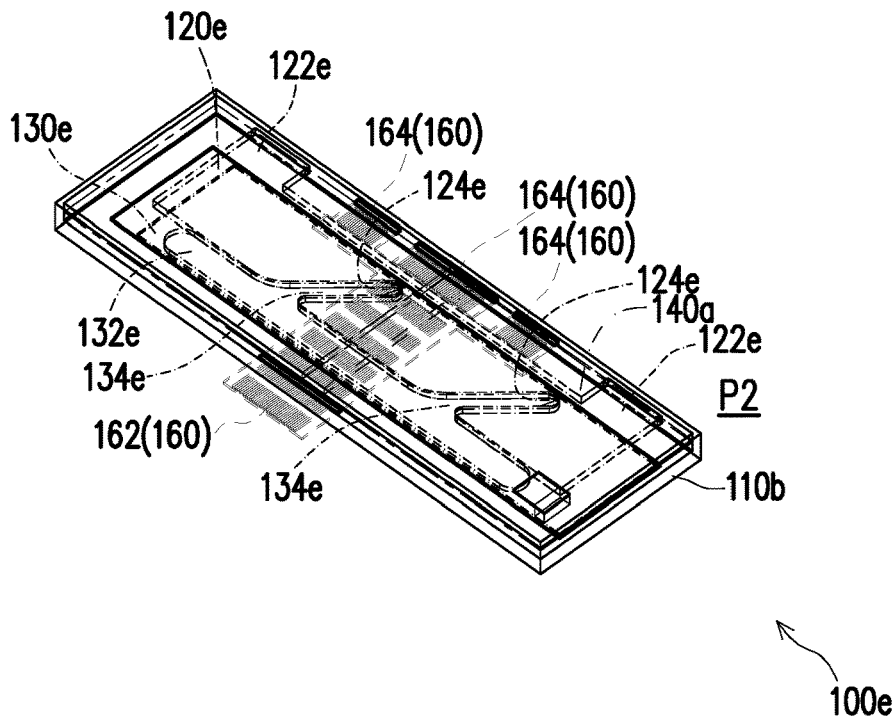

FIG. 6A shows a perspective exploded view of a connecting mechanism of another embodiment of the invention. FIG. 6B and FIG. 6C are respectively perspective views of the connecting mechanism of FIG. 6A in a locked state and an unlocked state. Referring first to FIG. 2A and FIG. 6A simultaneously, a connecting mechanism 100e of the present embodiment is similar to the connecting mechanism 100a in FIG. 2A. The main difference between the two is that the present embodiment has only one locking member 120e. In detail, openings 112b of the base 110b are only disposed on one side surface 113b. The locking member 120e is located between the limiting member 130e and the driving member 140a and has a plurality of limiting grooves 124e. The limiting member 130e includes a convex track body 132e and a plurality of sub-convex tracks 134e, wherein the sub-convex tracks 134e are connected to the convex track body 132e, and the sub-convex tracks 134e penetrate the limiting grooves 124e. The cover 150a is located between the driving member 140a and the locking member 120e, and the connector assembly 160 is fixed onto the locking member 120e.

After assembly, referring first to FIG. 1B, FIG. 6A, and FIG. 6B at the same time, when the driving member 140a is in the locked state, the locking portions 122e of the locking member 120e and the connectors 164 of the connector assembly 160 are respectively protruded from the openings 112b of the base 110b and extended into the first locking holes 34a1 of the second body 30. At this time, the second body 30 is assembled on the first body 20. Next, referring to FIG. 6B and FIG. 6C simultaneously, when the driving member 140a moves between the first position P1 and the second position P2, the sub-convex tracks 134e of the limiting member 130e respectively slide within the limiting grooves 124e of the locking member 120e. Then, for disassembly, referring to FIG. 6A and FIG. 6C simultaneously, when the driving member 140a is actuated from the locked state to the unlocked state, the driving member 140a drives the limiting member 130e to move and the locking member 120e moves relative to the base 110b such that the locking portions 122e and the connectors 164 are retracted into the base 110b, and therefore the second body 30 may be detached from the first body 20.

Figure 7A:
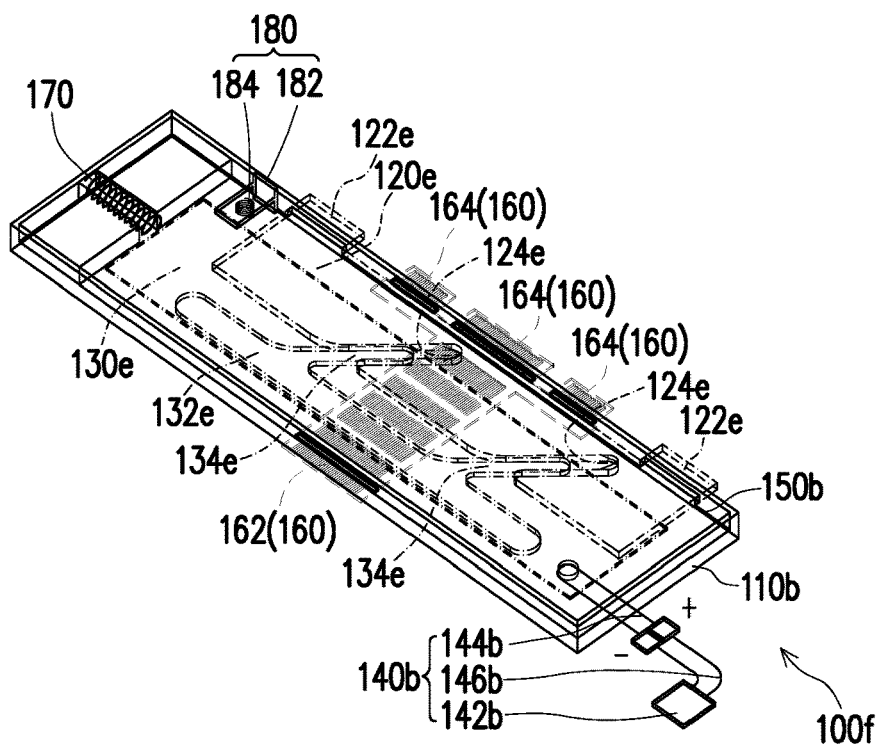
FIG. 7A and FIG. 7B are respectively perspective views of a connecting mechanism of another embodiment of the invention in a locked state and an unlocked state.
Figure 7B:
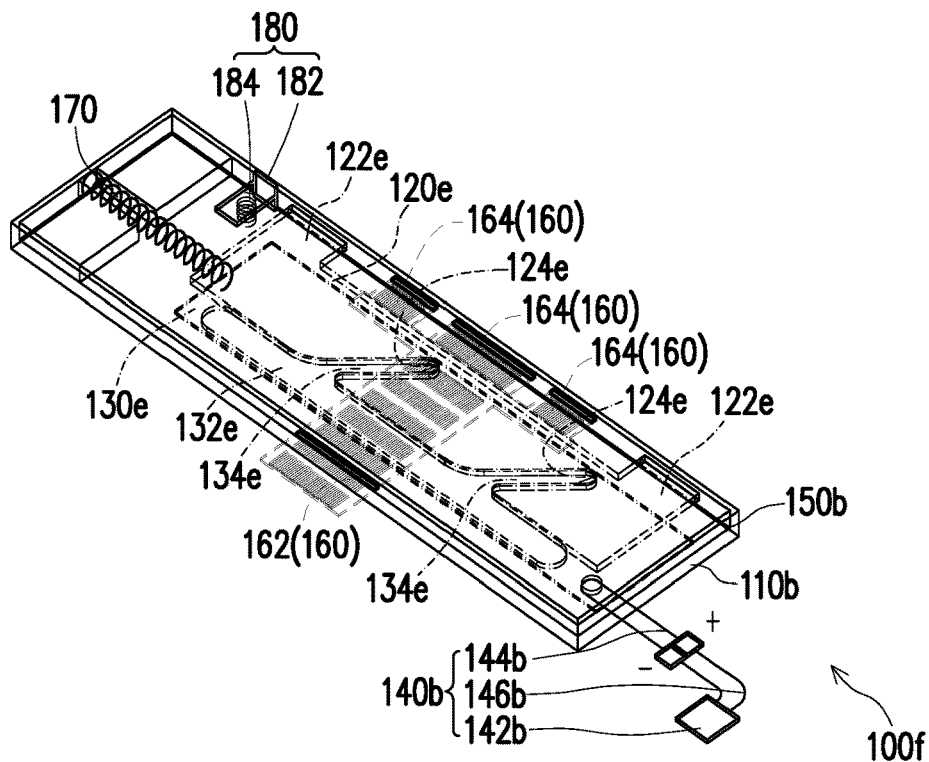

FIG. 7A and FIG. 7B are respectively perspective views of a connecting mechanism of another embodiment of the invention in a locked state and an unlocked state. Referring to FIG. 6B and FIG. 7A simultaneously, a connecting mechanism 100f of the present embodiment is similar to the connecting mechanism 100e of FIG. 6B. The main difference between the two is that the structural designs of the driving member 140b and the cover 150b of the present embodiment are different from the structural designs of the driving member 140a and the cover 150a in FIG. 6B.

In detail, the cover 150b of the present embodiment is embodied as a touch panel located above the locking member 120e. The driving member 140b includes a system power distributor 142b, a shape memory alloy 144b, and a power supply circuit 146b. The shape memory alloy 144b is connected and fixed onto the limiting member 130e. The power supply circuit 146b is connected to the shape memory alloy 144b and the system power distributor 142b. Furthermore, the connecting mechanism 100f of the present embodiment further includes an elastic member 170 and a blocking assembly 180. The elastic member 170 is connected to the limiting member 130e and the base 110b, wherein the elastic member 170 and the driving member 140b are respectively located at two opposite sides of the limiting member 130e. The blocking assembly 180 includes a blocking portion 182 and an elastic portion 184, wherein the elastic portion 184 is connected to the blocking portion 182 and the base 110b. The purpose of the blocking assembly 180 set-up is to hold the moving member 130e in the z-axis direction to prevent the moving member 130e from being elastically pulled back by the elastic member 170 in the x-axis direction. Here, the force direction of the elastic portion 184 (such as the z-axis direction) is different from the force direction of the elastic member 170 (such as the x-axis direction).

After assembly, referring first to FIG. 1B, FIG. 6A, and FIG. 7A simultaneously, when the driving member 140b is in the locked state, the locking portions 122e of the locking member 120e and the connectors 164 of the connector assembly 160 are respectively protruded from the openings 112b of the base 110b and extended into the first locking holes 34a1 of the second body 30. At this time, the blocking portion 182 of the blocking assembly 180 is leaned against the limiting member 130e, and the blocking portion 182 also interferes with the movement of the locking portions 122e of the locking member 120e in the x-axis direction to prevent the locking portions 122e of the locking member 120e from being elastically pulled back by the elastic member 170 in the x-axis direction.

For disassembly, referring to FIG. 1B and FIG. 7B, and FIG. 3C simultaneously, the cover 150b is touched first to transmit a signal to a control chip (not shown), and the control chip transmits the signal to the system power distributor 142b of the driving member 140b to inform that power is turned on. When the driving member 140b is actuated from the locked state to the unlocked state, the system power distributor 142b supplies power to the shape memory alloy 144b via the power supply circuit 146b. At this time, the power contact is turned on and contracted by heat to drive the limiting member 130e to move so as to stretch the elastic member 170, and the locking member 120e moves relative to the base 110b, such that the locking portions 122e and the connectors 164e are retracted into the base 110b. That is, when the system power distributor 142b supplies power to the shape memory alloy 144b, the limiting member 130e moves toward the stretching direction of the shape memory alloy 144b, thereby driving the locking member 120e to move relative to the base 110b. Since the limiting member 130e gives way, the potential energy of the elastic portion 184 of the blocking assembly 180 is released and the elastic portion 184 of the blocking assembly 180 is sprung in the z-axis direction, and the elastic portion 184 and the limiting member 130e interfere in the x-axis direction to hold the limiting member 130e to prevent the elastic member 170 from pulling back in the x-axis direction. At this time, the second body 30 may be detached from the first body 20.

Based on the above, in the design of the electronic device of the invention, the first body has a connecting mechanism, and the connecting mechanism drives the limiting member to move via the driving member and the locking member moves relative to the base, such that the locking portions are retracted into the base or protruded from the openings of the base and extended into the locking hole of the second body. Therefore, the second body may be detached or assembled on the first body. In short, the electronic device of the invention is relatively simple and convenient to assemble and detach.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electronic device, comprising:
    a first body comprising a connecting mechanism, the connecting mechanism comprising:
        a base, having at least one opening;
        at least one locking member, movably disposed in the base and comprising at least one locking portion;
        a limiting member, movably disposed in the base and connected to the locking member; and
        a driving member, connected to the limiting member; and
    a second body, detachably assembled to the first body and having a through hole, wherein at least one of a plurality of inner sidewalls of the through hole has at least one locking hole,
    wherein when the connecting mechanism of the first body is located in the through hole of the second body and the driving member is in a locked state, the locking portion of the locking member is protruded from the opening of the base and extended into the locking hole of the second body such that the second body is assembled on the first body, and when the driving member is actuated from the locked state to an unlocked state, the driving member drives the limiting member to move so as to drive the locking member moving relative to the base such that the locking portion is retracted into the base and the second body can be detached from the first body.

2. The electronic device of claim 1, wherein the at least one opening of the base comprises a plurality of first openings and a plurality of second openings opposite to each other, the at least one locking member comprises a first locking member and a second locking member, the at least one locking portion comprises a plurality of first locking portions and a plurality of second locking portions, and the at least one locking hole comprises a plurality of first locking holes and a plurality of second locking holes.

3. The electronic device of claim 2, wherein the first locking member and the second locking member are sequentially disposed in the base, the first locking member comprises a plurality of first convex shafts and the first locking portions, the second locking member comprises a plurality of second convex shafts and the second locking portions, the limiting member is located between the first locking member and the second locking member and has a plurality of first limiting grooves and a plurality of second limiting grooves, the first convex shafts penetrate the first limiting grooves, the second convex shafts penetrate the second limiting grooves, the first limiting grooves are extended along a first tilt direction, the second limiting grooves are extended along a second tilt direction, and the first tilt direction is different from the second tilt direction.

4. The electronic device of claim 3, wherein the connecting mechanism further comprises:
    a cover located between the driving member and the second locking member and comprising a first portion and a second portion, wherein the first portion has a limiting opening, the driving member is movably disposed on the first portion, a driving portion of the driving member passes through the limiting opening for connecting to the limiting member and driving the limiting member to move, and the second portion has a height difference with the first portion; and
    a connector assembly fixed onto the first locking member and comprising a connector cable and a plurality of connectors connected to the connector cable;
    wherein when the driving member is in the locked state, the first locking portions of the first locking member and the connectors of the connector assembly are respectively protruded from the first opening of the base and extended into the first locking holes of the second body, the second locking portions of the second locking member are protruded from the second opening of the base and extended into the second locking holes of the second body, and when the driving member is actuated from the locked state to the unlocked state, the driving member drives the limiting member to move so as to drive the first locking member and the second locking member moving relative to the base, such that the first locking portions, the second locking portions, and the connectors are retracted into the base.

5. The electronic device of claim 4, wherein the driving member is in a first position corresponding to the locked state, and the driving member is in a second position corresponding to the unlocked state, and when the driving member moves between the first position and the second position, the first convex shafts of the first locking member and the second convex shafts of the second locking member respectively slide within the first limiting grooves and the second limiting grooves of the limiting member, and when the driving member is in the first position or the second position, the first convex shafts and the second convex shafts are respectively located on different reference lines.

6. The electronic device of claim 3, wherein the driving member comprises:
   a system power distributor;
   a shape memory alloy connected and fixed onto the limiting member; and
   a power supply circuit connected to the shape memory alloy and the system power distributor.

7. The electronic device of claim 6, wherein the connecting mechanism further comprises:
   a cover located above the second locking member;
   an elastic member connected to the limiting member and the base, wherein the elastic member and the driving member are respectively located at two opposite sides of the limiting member;
   a connector assembly fixed onto the first locking member and comprising a connector cable and a plurality of connectors connected to the connector cable; and
   a blocking assembly comprising a blocking portion and an elastic portion, wherein the elastic portion is connected to the blocking portion and the base, and a force direction of the elastic portion is different from a force direction of the elastic member;
   wherein when the driving member is in the locked state, the first locking portions of the first locking member are respectively protruded from the first openings of the base and extended into the first locking holes of the second body, the second locking portions of the second locking member and the connectors of the connector assembly are respectively protruded from the second openings of the base and extended into the second locking holes of the second body, the blocking portion of the blocking assembly is leaned against the limiting member, and when the driving member is actuated from the locked state to the unlocked state, the system power distributor supplies power to the shape memory alloy via the power supply circuit to drive the limiting member to move so as to stretch the elastic member, and the first locking member and the second locking member move relative to the base such that the first locking portions, the second locking portions, and the connectors are retracted into the base.

8. The electronic device of claim 2, wherein the first locking member and the second locking member are located on a same plane, the first locking member comprises a plurality of first limiting grooves and the first locking portions, the second locking member comprises a plurality of second limiting grooves and the second locking portions, the limiting member is located between the base and both of the first locking member and the second locking member and comprises a convex track body and a plurality of first convex tracks and a plurality of second convex tracks connected to the convex track body, the first convex tracks penetrate the first limiting grooves, the second convex tracks penetrate the second limiting grooves, the first limiting grooves are extended along a first tilt direction, the second limiting grooves are extended along a second tilt direction, and the first tilt direction is different from the second tilt direction.

9. The electronic device of claim 8, wherein the connecting mechanism further comprises:
   a cover located between the driving member and both of the first locking member and the second locking member and comprising a first portion and a second portion, wherein the first portion has a limiting opening, the driving member is movably disposed on the first portion, a driving portion of the driving member passes through the limiting opening for connecting to the limiting member and driving the limiting member to move, and the second portion has a height difference with the first portion; and
   a connector assembly fixed onto the first locking member and comprising a connector cable and a plurality of connectors connected to the connector cable;
   wherein when the driving member is in the locked state, the first locking portions of the first locking member and the connectors of the connector assembly are respectively protruded from the first opening of the base and extended into the first locking holes of the second body, the second locking portions of the second locking member are protruded from the second opening of the base and extended into the second locking holes of the second body, and when the driving member is actuated from the locked state to the unlocked state, the driving member drives the limiting member to move and the first locking member and the second locking member move relative to the base, such that the first locking portions, the second locking portions, and the connectors are retracted into the base.

10. The electronic device of claim 9, wherein the driving member is in a first position corresponding to the locked state, the driving member is in a second position corresponding to the unlocked state, and when the driving member moves between the first position and the second position, the first convex tracks and the second convex tracks of the limiting member respectively slide within the first limiting grooves of the first locking member and the second limiting grooves of the second locking member.

11. The electronic device of claim 8, wherein the driving member comprises:
   a system power distributor;
   a shape memory alloy connected and fixed onto the limiting member; and
   a power supply circuit connected to the shape memory alloy and the system power distributor.

12. The electronic device of claim 11, wherein the connecting mechanism further comprises:
   a cover located above the first locking member and the second locking member;
   an elastic member connected to the limiting member and the base, wherein the elastic member and the driving member are respectively located at two opposite sides of the limiting member;
   a connector assembly fixed onto the first locking member and comprising a connector cable and a plurality of connectors connected to the connector cable; and a blocking assembly comprising a blocking portion and an elastic portion, wherein the elastic portion is connected to the blocking portion and the base, and a force direction of the elastic portion is different from a force direction of the elastic member;

wherein when the driving member is in the locked state, the first locking portions of the first locking member and the connectors of the connector assembly are respectively protruded from the first opening of the base and extended into the first locking holes of the second body, the second locking portions of the second locking member are respectively protruded from the second opening of the base and extended into the second locking holes of the second body, the blocking portion of the blocking assembly is leaned against the limiting member, when the driving member is actuated from the locked state to the unlocked state, the system power distributor supplies power to the shape memory alloy via the power supply circuit to drive the limiting member to move so as to stretch the elastic member, and the first locking member and the second locking member move relative to the base such that the first locking portions, the second locking portions, and the connectors are retracted into the base.

13. The electronic device of claim 1, wherein the at least one opening of the base is a plurality of openings, the at least one locking portion comprises a plurality of locking portions, the at least one locking hole is a plurality of locking holes, the limiting member comprises a convex track body and a plurality of sub-convex tracks, the sub-convex tracks are connected to the convex track body, the locking member is located between the limiting member and the driving member and has a plurality of limiting grooves, and the sub-convex tracks penetrate the limiting grooves.

14. The electronic device of claim 13, wherein the connecting mechanism further comprises:
a cover located between the driving member and the locking member and comprising a first portion and a second portion, wherein the first portion has a limiting opening, the driving member is movably disposed on the first portion, and a driving member of the driving member passes through the limiting opening for connecting to the limiting member and driving the limiting member to move, and the second portion has a height difference with the first portion; and
a connector assembly fixed onto the locking member and comprising a connector cable and a plurality of connectors connected to the connector cable;
wherein when the driving member is in the locked state, the locking portions of the locking member and the connectors of the connector assembly are respectively protruded from the openings of the base and extended into the locking holes of the second body, and when the driving member is actuated from the locked state to the unlocked state, the driving member drives the limiting member to move and the locking member moves relative to the base, such that the locking portions and the connectors are retracted into the base.

15. The electronic device of claim 14, wherein the driving member is in a first position corresponding to the locked state, the driving member is in a second position corresponding to the unlocked state, and when the driving member moves between the first position and the second position, the sub-convex tracks of the limiting member respectively slide within the limiting grooves of the locking member.

16. The electronic device of claim 13, wherein the driving member comprises:

a system power distributor;
a shape memory alloy connected and fixed onto the limiting member; and
a power supply circuit connected to the shape memory alloy and the system power distributor.

17. The electronic device of claim 16, wherein the connecting mechanism further comprises:
a cover located above the locking member;
an elastic member connected to the limiting member and the base, wherein the elastic member and the driving member are respectively located at two opposite sides of the limiting member;
a connector assembly fixed onto the locking member and comprising a connector cable and a plurality of connectors connected to the connector cable; and
a blocking assembly comprising a blocking portion and an elastic portion, wherein the elastic portion is connected to the blocking portion and the base, and a force direction of the elastic portion is different from a force direction of the elastic member;
wherein when the driving member is in the locked state, the locking portions of the locking member and the connectors of the connector assembly are respectively protruded from the openings of the base and extended into the locking hole of the second body, the blocking portion of the blocking assembly is leaned against the limiting member, and when the driving member is actuated from the locked state to the unlocked state, the system power distributor supplies power to the shape memory alloy via the power supply circuit to drive the limiting member to move and the locking member moves relative to the base to stretch the elastic member, such that the locking portions and the connectors are retracted into the base.

18. The electronic device of claim 1, wherein the base comprises a bottom surface and a plurality of side surfaces connected to the bottom surface, the at least one opening is disposed on at least one of the side surfaces, and the bottom surface and the side surfaces define an accommodating space.

19. The electronic device of claim 1, wherein the first body has a work plane, and the connecting mechanism is disposed on the work plane.

20. The electronic device of claim 1, wherein one of the first body and the second body is a display module and the other of the first body and the second body is a system host.

21. A connecting mechanism, comprising:
a base, having at least one opening;
at least one locking member, movably disposed in the base and comprising at least one locking portion;
a limiting member, movably disposed in the base and connected to the locking member; and
a driving member, connected to the limiting member, wherein when the driving member is in a locked state, the locking portion of the locking member is protruded from the opening of the base, and when the driving member is actuated from the locked state to an unlocked state, the driving member drives the limiting member to move so as to drive the locking member moving relative to the base such that the locking portion is retracted into the base.

22. The connecting mechanism of claim 21, wherein the at least one opening of the base comprises a plurality of first openings and a plurality of second openings opposite to each other, the at least one locking member comprises a first locking member and a second locking member, the at least one locking portion comprises a plurality of first locking portions and a plurality of second locking portions, and the at least one locking hole comprises a plurality of first locking holes and a plurality of second locking holes.

23. The connecting mechanism of claim 22, wherein the first locking member and the second locking member are sequentially disposed in the base, the first locking member comprises a plurality of first convex shafts and the first locking portions, the second locking member comprises a plurality of second convex shafts and the second locking portions, the limiting member is located between the first locking member and the second locking member and has a plurality of first limiting grooves and a plurality of second limiting grooves, the first convex shafts penetrate the first limiting grooves, the second convex shafts penetrate the second limiting grooves, the first limiting grooves are extended along a first tilt direction, the second limiting grooves are extended along a second tilt direction, and the first tilt direction is different from the second tilt direction.

24. The connecting mechanism of claim 23, further comprising:
a cover located between the driving member and the second locking member and comprising a first portion and a second portion, wherein the first portion has a limiting opening, the driving member is movably disposed on the first portion, a driving portion of the driving member passes through the limiting opening for connecting to the limiting member and driving the limiting member to move, and the second portion has a height difference with the first portion; and
a connector assembly fixed onto the first locking member and comprising a connector cable and a plurality of connectors connected to the connector cable.

25. The connecting mechanism of claim 23, wherein the driving member comprises:
a system power distributor;
a shape memory alloy connected and fixed onto the limiting member; and
a power supply circuit connected to the shape memory alloy and the system power distributor.

26. The connecting mechanism of claim 25, further comprising:
a cover located above the second locking member;
an elastic member connected to the limiting member and the base, wherein the elastic member and the driving member are respectively located at two opposite sides of the limiting member;
a connector assembly fixed onto the first locking member and comprising a connector cable and a plurality of connectors connected to the connector cable; and
a blocking assembly comprising a blocking portion and an elastic portion, wherein the elastic portion is connected to the blocking portion and the base, and a force direction of the elastic portion is different from a force direction of the elastic member.

27. The connecting mechanism of claim 22, wherein the first locking member and the second locking member are located on a same plane, the first locking member comprises a plurality of first limiting grooves and the first locking portions, the second locking member comprises a plurality of second limiting grooves and the second locking portions, the limiting member is located between the base and both of the first locking member and the second locking member and comprises a convex track body, a plurality of first convex tracks and a plurality of second convex tracks connected to the convex track body, the first convex tracks penetrate the first limiting grooves, the second convex tracks penetrate the second limiting grooves, the first limiting grooves are extended along a first tilt direction, the second limiting grooves are extended along a second tilt direction, and the first tilt direction is different from the second tilt direction.

28. The connecting mechanism of claim 27, further comprising:
a cover located between the driving member and both of the first locking member and the second locking member and comprising a first portion and a second portion, wherein the first portion has a limiting opening, the driving member is movably disposed on the first portion, a driving portion of the driving member passes through the limiting opening for connecting to the limiting member and driving the limiting member to move, and the second portion has a height difference with the first portion; and
a connector assembly fixed onto the first locking member and comprising a connector cable and a plurality of connectors connected to the connector cable.

29. The connecting mechanism of claim 27, wherein the driving member comprises:
a system power distributor;
a shape memory alloy connected and fixed onto the limiting member; and
a power supply circuit connected to the shape memory alloy and the system power distributor.

30. The connecting mechanism of claim 29, further comprising:
a cover located above the first locking member and the second locking member;
an elastic member connected to the limiting member and the base, wherein the elastic member and the driving member are respectively located at two opposite sides of the limiting member;
a connector assembly fixed onto the first locking member and comprising a connector cable and a plurality of connectors connected to the connector cable; and
a blocking assembly comprising a blocking portion and an elastic portion, wherein the elastic portion is connected to the blocking portion and the base, and a force direction of the elastic portion is different from a force direction of the elastic member.

31. The connecting mechanism of claim 21, wherein the at least one opening of the base is a plurality of openings, the at least one locking portion comprises a plurality of locking portions, the at least one locking hole is a plurality of locking holes, the limiting member comprises a convex track body and a plurality of sub-convex tracks, the sub-convex tracks are connected to the convex track body, the locking member is located between the limiting member and the driving member and has a plurality of limiting grooves, and the sub-convex tracks penetrate the limiting grooves.

32. The connecting mechanism of claim 31, further comprising:
a cover located between the driving member and the locking member and comprising a first portion and a second portion, wherein the first portion has a limiting opening, the driving member is movably disposed on the first portion, a driving portion of the driving member passes through the limiting opening for connecting to the limiting member and driving the limiting member to move, and the second portion has a height difference with the first portion; and
a connector assembly fixed onto the first locking member and comprising a connector cable and a plurality of connectors connected to the connector cable.

33. The connecting mechanism of claim 31, wherein the driving member comprises:
- a system power distributor;
- a shape memory alloy connected and fixed onto the limiting member; and
- a power supply circuit connected to the shape memory alloy and the system power distributor.

34. The connecting mechanism of claim 33, further comprising:
- a cover located above the locking member;
- an elastic member connected to the limiting member and the base, wherein the elastic member and the driving member are respectively located at two opposite sides of the limiting member;
- a connector assembly fixed onto the locking member and comprising a connector cable and a plurality of connectors connected to the connector cable; and
- a blocking assembly comprising a blocking portion and an elastic portion, wherein the elastic portion is connected to the blocking portion and the base, and a force direction of the elastic portion is different from a force direction of the elastic member.

35. The connecting mechanism of claim 21, wherein the base comprises a bottom surface and a plurality of side surfaces connected to the bottom surface, the at least one opening is disposed on at least one of the side surfaces, and the bottom surface and the side surfaces define an accommodating space.

* * * * *